United States Patent
Takeuchi et al.

(10) Patent No.: US 7,241,694 B2
(45) Date of Patent: Jul. 10, 2007

(54) METHOD FOR MANUFACTURING SEMICONDUCTOR DEVICE HAVING TRENCH IN SILICON CARBIDE SEMICONDUCTOR SUBSTRATE

(75) Inventors: Yuuichi Takeuchi, Obu (JP); Rajesh Kumar Malhan, Nagoya (JP); Hiroyuki Matsunami, Yawata (JP); Tsunenobu Kimoto, Kyoto (JP)

(73) Assignee: DENSO Corporation, Kariya (JP)

( * ) Notice: Subject to any disclaimer, the term of this patent is extended or adjusted under 35 U.S.C. 154(b) by 282 days.

(21) Appl. No.: 11/105,587

(22) Filed: Apr. 14, 2005

(65) Prior Publication Data

US 2005/0233539 A1  Oct. 20, 2005

(30) Foreign Application Priority Data

| Apr. 14, 2004 | (JP) | ............... 2004-118890 |
| Jun. 30, 2004 | (JP) | ............... 2004-193459 |
| Jun. 30, 2004 | (JP) | ............... 2004-193460 |

(51) Int. Cl.
 H01L 21/18 (2006.01)
 H01L 21/302 (2006.01)
 H01L 21/308 (2006.01)

(52) U.S. Cl. ............ 438/700; 438/186; 438/195; 438/270; 438/589

(58) Field of Classification Search ............ 438/700, 438/186, 192, 193, 195, 270, 589; 216/17, 216/18, 79
See application file for complete search history.

(56) References Cited

U.S. PATENT DOCUMENTS

| 4,735,920 | A | * | 4/1988 | Stephani et al. ............ 438/718 |
| 5,270,244 | A | * | 12/1993 | Baliga .................. 438/440 |
| 5,323,040 | A | * | 6/1994 | Baliga .................. 257/332 |
| 5,436,174 | A | * | 7/1995 | Baliga et al. ............ 438/705 |
| 5,742,076 | A | * | 4/1998 | Sridevan et al. ............ 257/77 |
| 5,744,826 | A | | 4/1998 | Takeuchi et al. |
| 5,753,938 | A | * | 5/1998 | Thapar et al. ............ 257/77 |
| 5,915,180 | A | * | 6/1999 | Hara et al. ............. 438/270 |
| 6,100,132 | A | | 8/2000 | Sato et al. |
| 6,133,587 | A | | 10/2000 | Takeuchi et al. |
| 6,362,495 | B1 | * | 3/2002 | Schoen et al. ............ 257/77 |

(Continued)

FOREIGN PATENT DOCUMENTS

JP   A-2003-69041   3/2003

(Continued)

OTHER PUBLICATIONS

Nordell et al., Growth of 4H and 6H SiC in Trenches and Around Stripe Mesas, 1998, pp. 131-134.

*Primary Examiner*—M. Wilczewski
(74) *Attorney, Agent, or Firm*—Posz Law Group, PLC

(57) ABSTRACT

A method for manufacturing a silicon carbide semiconductor device includes the steps of: forming a trench mask on an upper surface of a semiconductor substrate; forming the trench such that the trench having an aspect ratio equal to or larger than 2 and having a trench slanting angle equal to or larger than 80 degrees is formed; and removing a damage portion in such a manner that the damage portion disposed on an inner surface of the trench formed in the semiconductor substrate in the step of forming the trench is etched and removed in hydrogen atmosphere under decompression pressure at a temperature equal to or higher than 1600° C.

28 Claims, 22 Drawing Sheets

U.S. PATENT DOCUMENTS

| | | |
|---|---|---|
| 6,406,982 B2 | 6/2002 | Urakami et al. |
| 6,475,889 B1 * | 11/2002 | Ring ........................ 438/571 |
| 6,600,189 B1 | 7/2003 | Sato et al. |
| 6,670,278 B2 * | 12/2003 | Li et al. ..................... 438/710 |
| 6,853,006 B2 * | 2/2005 | Kataoka et al. ............... 257/77 |
| 7,125,786 B2 * | 10/2006 | Ring et al. .................. 438/571 |
| 2001/0053561 A1 * | 12/2001 | Kitabatake et al. ........... 438/99 |
| 2002/0052102 A1 * | 5/2002 | Kiritani ...................... 438/590 |
| 2002/0158301 A1 | 10/2002 | Urakami et al. |
| 2006/0097268 A1 * | 5/2006 | Kumar et al. ................. 257/77 |
| 2007/0015333 A1 * | 1/2007 | Kishimoto et al. ......... 438/259 |
| 2007/0023781 A1 * | 2/2007 | Mizukami et al. .......... 257/192 |

FOREIGN PATENT DOCUMENTS

| | | |
|---|---|---|
| JP | A-2003-218038 | 7/2003 |

* cited by examiner

FIG. 8A
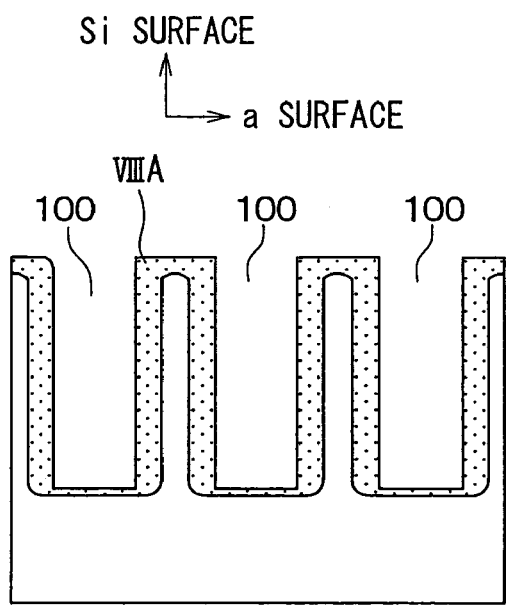
FIG. 8B
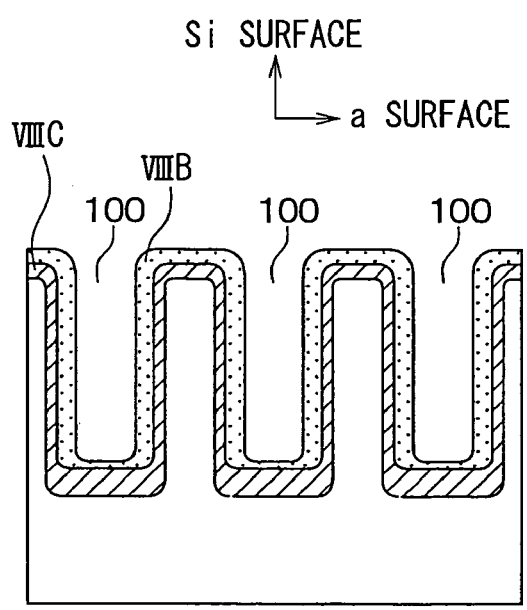
FIG. 9
| GROWTH RATE ($\mu$m/h) | SUBSTRATE TEMP. (°C) / ASPECT RATIO | 1500 | 1550 | 1600 | 1625 | 1650 |
|---|---|---|---|---|---|---|
| ~2.5 | 1 | × | × | ○ | ○ | ○ |
| | 2 | × | × | × | ○ | ○ |
| ~5 | 1 | × | × | × | × | × |

| PRESSURE (Torr) \ SUBSTRATE TEMP. (°C) | 1500 | 1550 | 1600 | 1625 | 1650 |
|---|---|---|---|---|---|
| 200 | × | × | △ | ○ | ○ |
| 600 | × | △ | ○ | ○ | ○ |

FIG. 20A
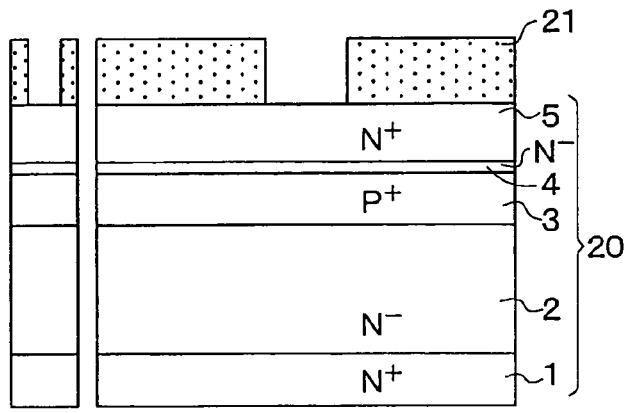
FIG. 20B
FIG. 20D
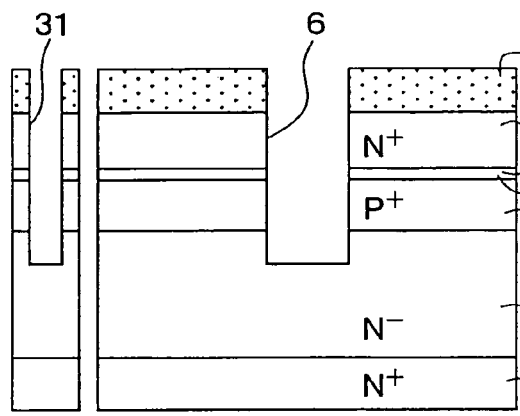
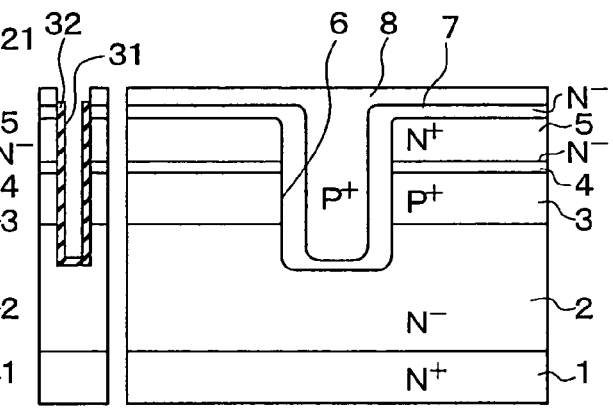
FIG. 20C
FIG. 20E
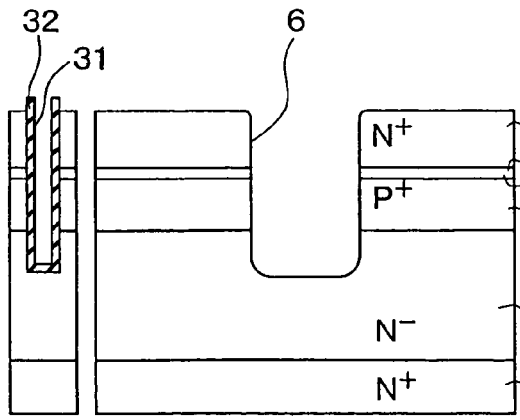
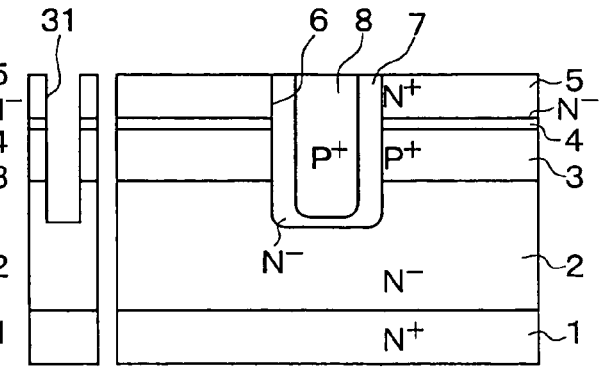

FIG. 24

| GROWTH RATE ($\mu$m/h) | SUBSTRATE TEMP. (°C) / ASPECT RATIO | 1500 | 1550 | 1600 | 1625 | 1650 |
|---|---|---|---|---|---|---|
| ~2.5 | 1 | × | × | ○ | ○ | ○ |
| | 2 | × | × | × | ○ | ○ |
| ~5 | 1 | × | × | × | × | × |

US 7,241,694 B2

METHOD FOR MANUFACTURING SEMICONDUCTOR DEVICE HAVING TRENCH IN SILICON CARBIDE SEMICONDUCTOR SUBSTRATE

CROSS REFERENCE TO RELATED APPLICATIONS

This application is based on Japanese Patent Applications No. 2004-118890 filed on Apr. 14, 2004, No. 2004-193459 filed on Jun. 30, 2004, and No. 2004-193460 filed on Jun. 30, 2004, the disclosures of which are incorporated herein by reference.

FIELD OF THE INVENTION

The present invention relates to a method for manufacturing a semiconductor device having a trench in a silicon carbide semiconductor substrate.

BACKGROUND OF THE INVENTION

Conventionally, the embedding technique of the silicon carbide semiconductors is disclosed in, for example, Materials Science Forum P131–134, Vols. 264–268, 1988.

In this document, while various samples were employed, the trench inclination angles of which are approximately 50 degrees, and these samples own various sorts of trench widths, the aspect ratios of which are equal to or smaller than 1, such experiments have been carried out. That is, the epitaxial growing processes have been performed under such a condition that growth temperatures are 1480° C. and 1620° C., and C/Si ratios are 1.2 and 4.0.

In the above document, while the growth shapes of the epitaxial layers may strongly depend upon the C/Si ratios rather than the growth temperatures, in such a case that the C/Si ratio becomes low, the growth mode of the epitaxial layer becomes the surface reaction rate controlling, and thus, becomes the facet plane growth in which a plurality of facet faces appear, whereas in the case that the C/Si ratio is high, the growth mode of the epitaxial layer becomes the vapor phase diffusion rate controlling.

Also, as conventional techniques for embedding inner portions of trenches by epitaxial films, a large number of conventional techniques related to silicon semiconductors have been disclosed. For instance, Japanese Patent Publication No. 3424667 discloses the following technical idea. That is, rough faces and crystal defects as to inner planes (namely, side planes and bottom planes) of a trench, which occur in a trench etching step, are thermally processed in a non-oxidation atmosphere so as to smooth the inner planes of the trench, and thus, the crystalline of the embedded layer may be improved.

Also, Japanese Patent Application Publication No. 2003-218038 discloses the effect capable of round-shaping a corner portion of a trench bottom portion, while a stress of the trench bottom portion is relaxed and lowering of a growth rate in the trench bottom portion can be prevented. This conventional technique may be understood in the following different way when the view point of the described fact is changed. That is, when such a region is small where the growth of specific planes (for example, both bottom plane and side plane) joins with each other, a stress is increased. However, since a corner is rounded (namely, specific planes do not appear), a region where the growth of the specific planes joins with each other is made large so as to relax a stress. In other words, such a fact that the corner portion of the trench bottom plane is shaped as a round corner may constitute a necessary condition required for relaxing a crystal stress during growth, and for forming an embedding layer having a better crystalline characteristic.

However, in the case that the N type channel layer and the P+ type gate region, which will be formed inside the trench in the silicon carbide trench J-FET disclosed in JP-A-2003-69041, such a problem occurs which cannot be solved by the above-explained conventional techniques. More specifically, in such a case that the aspect ratio of the trench is equal to or larger than 2, and the inclination angle is substantially vertical, this problem may occur which cannot be solved by the conventional techniques.

That is to say, the below-mentioned problem is provided as to the embedding process of the trench in which the subject inclination angle is vertical and the aspect ratio is high. Namely, under the condition of the high C/Si ratio, since the supply of the material gas into the trench is decreased, as compared with that of the non-trench portion, when the N type channel layer is formed, the shape thereof is brought into an overhang state, whereas when the P+ type gate region is formed, the cavity is produced in the trench. In addition, since the growth rate of the trench inner portion is necessarily lower than that of the non-trench portion, even when the P+ type gate region could be embedded without an occurrence of such a cavity, there is another problem that the removing film thickness of the unnecessary epitaxial film in the etch-back step after the embedding step may surely become larger than the depth of the trench.

Also, the facet plane growth may occupy the dominant position under the low C/Si ratio condition. However, the above documents do not clarify a difference between the growth rates depending upon the face orientation. Furthermore, the above documents never disclose any clear indications how to increase the growth rate of the trench inner portion, as compared with that of the non-trench portion, and also how to decrease the removing film thickness of the unnecessary epitaxial film in the etch-back step after the embedding process.

Also, smoothening of an inner face of a trench in a silicon technique is realized by utilizing a feature of an Si crystal fluidity (refer to, for example, JP-A-11-74483) during a thermal processing operation, which can effectively reduce surface concaves/convexes and crystal defects. Moreover, at the same time, a corner portion of a trench may be rounded, and while a trench width is not substantially changed, a trench opening portion may be enlarged, so that a supply of material gas into the trench can be effectively increased. Since a trench bottom portion has no corner portion, the crystalline of the embedding layer may become superior, and furthermore, electric field concentration occurred when a semiconductor element is turned off may be suppressed due to the shape thereof.

On the other hand, since there is no liquid phase state in silicon carbide, there is no fluidity. As a result, in silicon carbide, in order to remove the rough faces of the trench inner planes (side plane and bottom plane) and the crystal defect, which occur in the trench etching step, the silicon carbide crystal region containing the rough faces and the crystal defect must be removed by the etching process. However, there are other problems. As to silicon carbide, there are no clear indication as to a wet etching fluid and a dry etching condition, which are capable of effectively removing a trench etching damage. Also, a sacrifice oxidation owns such a problem that an oxidation rate is low and a long oxidation time is required.

As other effective etching techniques, there are a hydrogen etching process and an HCL etching process, which are generally utilized as a growth pre-process for plane epitaxial growth. Normally, in these techniques, even in Si, the etching processes are employed at a temperature of approximately 1000° C., and it is easily conceivable that even in silicon carbide, a similar mechanism is operated. However, the mechanism as to Si is completely different from the mechanism as to silicon carbide.

In other words, in Si, the fluidity of Si is quickened in a thermal process operation at a temperature of approximately 1000° C., so as to recrystalline Si, so that the rough faces and the crystal defects are removed. As a result, when a non-oxidation atmosphere is employed as the atmosphere, then a sufficiently large effect may be obtained. On the other hand, since silicon carbide is constructed of two chemical elements namely, C and Si, and owns no fluidity, the respective elements must be removed from a substrate surface. Normally, the C element as a carbon is reacted with high temperature hydrogen so as to be removed as hydrocarbon (CxHy), whereas the Si element as a silicon is removed by vaporization operation under reduced pressure. As a consequence, in the etching process of silicon carbide, either a hydrogen atmosphere at a temperature equal to or higher than 1300° C. under reduced pressure or such a hydrogen atmosphere to which HCl equal to or higher than 1300° C. has been added under the normal pressure is necessarily required. As a result, when the thermal process is carried out in the hydrogen atmosphere to which HCl is not added under the normal pressure, only C elements are removed, and removing of Si elements is disturbed. As a consequence, a so-called "Si droplet" phenomenon may occur where only Si elements are left in the substrate surface and are condensed. This "Si droplet" phenomenon never occurs in the Si technique.

While the silicon carbide etching process owns such a feature, in the case that this silicon carbide etching process is applied to the trench shape, no detailed discussion example has been so far made. Therefore, there are various problems: a difference in etching rates depending upon face orientation of etching planes is not clarified; how to round a trench corner portion while preventing the surface reaction rate controlling by which a plurality of facet planes are produced; and also, the condition thereof is not clarified. Furthermore, in the case that the trench etching damage region of the trench inner planes (side plane and bottom plane) has been removed, there is no clear indication as to the reducing effects for reducing the surface convexs/concaves, and the crystal defects.

SUMMARY OF THE INVENTION

In view of the above-described problem, it is an object of the present invention to provide a method of manufacturing a semiconductor device having a trench in a silicon carbide semiconductor substrate. The device has excellent crystallinity.

A method for manufacturing a silicon carbide semiconductor device is characterized in that: in the step of forming a trench mask, the trench mask as a mask for trench etching is formed on an upper surface of a semiconductor substrate made of silicon carbide; in the step of forming a trench, the substrate is etched by using the mask for trench etching so that the trench having an aspect ratio equal to or larger than 2 and having a trench slanting angle equal to or larger than 80 degrees is formed in the substrate; and in the step of removing a damage portion, the damage portion disposed on an inner surface of the trench formed in the semiconductor substrate by a trench etching process is etched and removed in hydrogen atmosphere under decompression pressure at a temperature equal to or higher than 1600° C.

The above method provides the device having excellent crystallinity. Specifically, since the damage portion is etched in hydrogen atmosphere under decompression pressure at a temperature equal to or higher than 1600° C., the damage portion can be removed in short time because of the characteristics of high temperature hydrogen. Further, no surface concavity/convexity and no degeneration layer exists in the trench so that the energy level caused by the degeneration layer is not formed. Furthermore, the surface concavity/convexity can be reduced.

As a result, in the latter step of performing the epitaxial growth, the surface concavity/convexity is extremely reduced, so that an energy level in the epitaxial layer caused by the surface concavity/convexity is prevented from generating. Thus, the PN junction between each layer composing the semiconductor substrate and the epitaxial layer becomes a junction having small amount leak current. The device has excellent crystallinity.

Preferably, the trench mask is formed on the substrate having a (0001)-Si surface.

In this case, since the damage portion is etched in hydrogen atmosphere under decompression pressure at a temperature equal to or higher than 1600° C., the damage portion can be removed in short time because of the characteristics of high temperature hydrogen. Further, the etching rate of the a-face as the sidewall of the trench is larger than that of the Si-face as the bottom of the trench. Therefore, the concavity/convexity of the sidewall, which is larger than the concavity/convexity of the bottom and generated in the step of forming the trench, is selectively etched. Thus, the concavity/convexity of the inner surface of the trench is removed effectively in short time.

As a result, in the latter step of performing the epitaxial growth, the surface concavity/convexity is extremely reduced, so that an energy level in the epitaxial layer caused by the surface concavity/convexity is prevented from generating. Thus, the PN junction between each layer composing the semiconductor substrate and the epitaxial layer becomes a junction having small amount leak current.

Preferably, the trench mask is formed on the substrate having a (000-1)-C surface.

In this case, since the damage portion is etched in hydrogen atmosphere under decompression pressure at a temperature equal to or higher than 1600° C., the damage portion can be removed in short time because of the characteristics of high temperature hydrogen. In this case, the etching rate of the C-face as the bottom of the trench is larger than that of the a-face as the side of the trench. Therefore, the etching alteration layer on the bottom, which is formed in the trench forming process and deeper than the sidewall, can be selectively removed. Thus, the alteration layer in the trench is effectively eliminated.

As a result, in the latter step of performing the epitaxial growth, the energy level at the interface between the substrate and the epitaxial layer is prevented from generating. Therefore, although the PN junction is formed between each layer composing the semiconductor substrate and the epitaxial layer, the PN junction can provide the junction having small leakage current.

Preferably, the step of removing the trench mask as the mask for trench etching is performed before the step of removing the damage portion. Thus, the trench mask for trench etching is removed before the step of removing the damage portion, so that the influence of the impurity in the trench mask is completely removed in the epitaxial growth step.

Preferably, the method further includes the step of: forming a selection mask in such a manner that the selection mask as a mask for selective epitaxial growth is formed on a part of the upper surface of the semiconductor substrate (1) after the step of removing the trench mask, the part being different from the trench.

In this case, since the selection mask is formed in the trench region for alignment, the embedding effect in the epitaxial growth step is prevented. Thus, the alignment before and after the epitaxial growth step is secured. Further, after the selection mask is removed, in the step of etch back, the etch back is performed together with measuring the depth of the trench for the alignment so that the predetermined etching amount is controlled.

Preferably, in the step of removing the damage portion, the damage portion is removed by using a vapor phase diffusion rate control reaction so that a corner of the trench is rounded.

In this case, since the corner is rounded, the raw material gas is effectively promoted to penetrate into the trench through the opening of the trench in the step of the epitaxial growth as the next step. Further, the distance of the non-trench plane area between the neighboring trench patterns becomes shorter. Thus, the over-hang shape formed in case of the high aspect ratio of the trench is prevented from generating. Furthermore, the growth at the non-trench plane area is limited.

Thus, even when the epitaxial layer is formed in the latter step, the growth at the non-trench area is limited, and the epitaxial layer can be embedded into the trench without cavity. On the other hand, since the crystal stress at the bottom of the trench generated in the step of the epitaxial growth is diversified and reduced, the epitaxial film having high crystal quality is formed.

Preferably, in the step of removing the damage portion, the damage portion is removed by using a vapor phase diffusion rate control reaction so that a corner of the trench is isotropically etched and rounded.

In this case, since the corner is rounded, the raw material gas is effectively promoted to penetrate into the trench through the opening of the trench in the step of the epitaxial growth as the next step. Therefore, the over-hang shape formed in case of the high aspect ratio of the trench is prevented from generating. Thus, even when the epitaxial layer is formed in the latter step, the epitaxial layer can be embedded into the trench without cavity. On the other hand, since the crystal stress at the bottom of the trench generated in the step of the epitaxial growth is diversified and reduced, the epitaxial film having high crystal quality is formed.

More preferably, in the step of removing the damage portion, the damage portion is removed under a condition of $P \times 1.33 \times 10^2 \geq a/T - b$, in which P represents an atmospheric pressure (in Pa), T represents a substrate temperature (in ° C.), a represents $4.16 \times 10^6$, and b represents $2.54 \times 10^4$.

Preferably, the step of removing the damage portion is performed at a temperature equal to or lower than 1700° C. This is, since the step bunching is occurred on the substrate surface when the temperature exceeds over 1700° C., the temperature is set to be equal to or lower than 1700° C. so that the step bunching is not occurred.

Preferably, in the step of removing the damage portion, the damage portion is removed by a heat treatment in a hydrogen atmosphere including hydrocarbon. Thus, the hydrocarbon is added in the atmosphere so that the carbon atoms in the silicon carbide crystal are limited from etching. Thus, the total etching rate is reduced, so that the etching reaction further shifts to the vapor phase diffusion rate control side. Accordingly, when the heat treatment is performed in the hydrogen atmosphere including the hydrocarbon, the corner of the trench is rounded easily compared with the atmosphere only including the hydrogen gas.

Preferably, in the step of removing the damage portion, the damage portion is removed by a heat treatment in a hydrogen atmosphere including inert gas. When the atmospheric pressure is constant, and the inert gas such as Ar gas is added, the concentration of the hydrogen gas is relatively reduced. Accordingly, although the diffusion effect of the reaction product is not changed, the etching rate is reduced. Thus, the etching reaction shifts to the vapor phase diffusion rate control side, similar to the case where the hydrogen atmosphere including the hydrocarbon. Thus, when inert gas such as Ar gas is added, the corner of the trench is rounded easily compared with the atmosphere only including the hydrogen gas.

Preferably, a distance between the trenches having a predetermined pattern is shortened in such a manner that a flat surface of the Si surface between the trenches disappears in a latter step of forming an embedded layer after the step of removing the damage portion.

In this case, the distance between the trenches having a predetermined pattern is appropriately determined, so that the growth of the Si-surface having the largest growth rate is not occurred, and the growth rate of the non-trench region is reduced by the influence of the a-surface etching effect, which affects the non-trench region from a side. Thus, the growth rate becomes larger from the upper side of the trench, the lower side of the trench, the non-trench region, to the bottom of the trench in this order. Therefore, the overhanging state in the initial step is not occurred, and further, the cavity in the final step is not generated. Furthermore, the growth rate in the trench becomes larger, compared with the non-trench region.

Preferably, the distance between the trench patterns is equal to or smaller than the trench width.

Preferably, the epitaxial layer is formed in the trench at a temperature equal to or higher than 1500° C. by an epitaxial growth method after the step of removing the damage portion.

Even when the epitaxial growth is performed in the low temperature range, supply amount of the raw material gas is controlled to balance between the etching amount and the deposition amount so that the growth rate is reduced. Thus, crystal growth having the growth rate, which becomes larger from the trench sidewall, the non-trench region, the trench bottom in this order, is performed. Further, at the same time, the growth rate of the lower portion of the sidewall is larger than that of the upper portion of the sidewall, so that the over-hang shape is limited from forming.

Preferably, when the process temperature of the epitaxial layer is equal to or higher than 1550° C., the etching and the deposition are both activated. Thus, the total growth rate is increased.

Further, when the process temperature of the epitaxial layer is equal to or higher than 1625° C., the embedded layer having no cavity is formed in short time even since the over-hang shape is not formed in a case where the growth rate in the trench is increased up to about 2.5 µm/hr.

Preferably, the step of removing the damage portion and the step of forming the epitaxial layer are successionally performed by using same equipment.

Thus, since the step of removing the damage portion and the step of forming the epitaxial layer are performed in the same equipment, the semiconductor substrate is not exposed in the outside atmosphere. Therefore, amount of contamination adhered on the substrate surface is reduced. Further, time for increasing and decreasing temperature of the substrate is not required, so that the throughput of the semiconductor device is improved.

Preferably, the step of forming the epitaxial layer is performed by using a vapor phase diffusion rate control reaction so that a corner of the epitaxial layer is rounded.

Thus, epitaxial layer having the rounded corner with no multiple facet surfaces is formed by the vapor phase diffusion rate control reaction. The crystal stress in the epitaxial growth process is dispersed and reduced, so that the epitaxial film having high crystal quality is formed.

Preferably, in the step of forming the epitaxial layer, a growth rate of the epitaxial layer is equal to or smaller than 2.5 μm per hour. Since the growth rate is set to be above described value, the epitaxial layer is formed by the vapor phase diffusion rate control reaction. Thus, multiple facet surfaces are prevented from forming.

Preferably, in the step of forming the epitaxial layer, a growth rate of the epitaxial layer at the sidewall of the trench is equal to or smaller than 2.5 μm per hour. Since the growth rate is set to be above described value, the epitaxial layer is formed by the vapor phase diffusion rate control reaction. Thus, multiple facet surfaces are prevented from forming.

Preferably, the step of forming the epitaxial layer is performed at a temperature equal to or lower than 1700° C.

Preferably, in the step of forming the epitaxial layer, the epitaxial growth is performed by using a gas including a raw material gas, a carrier gas and a gas having etching effect.

Thus, the gas having the etching effect is introduced, so that the etching effect and the deposition effect are balanced appropriately even when the epitaxial growth is performed in comparatively low temperature. Thus, the etching rate of the a-surface can be larger than that of the Si-surface. The growth rate in the trench can be increased, compared with the non-trench region. For example, as described in claim 19, the gas having such etching effect is a hydrochloric gas.

Preferably, in the step of forming the epitaxial layer, a concentration control is performed in such a manner that an impurity concentration in the beginning of the epitaxial growth is different from that in the ending of the epitaxial growth. For example, the impurity concentration is controlled in such a manner that the impurity concentration in the ending of the epitaxial growth is higher than that in the beginning of the epitaxial growth.

The impurity concentration control is performed appropriately, so that the crystal strain becomes smaller in the initial growth layer for providing the PN junction boundary since the impurity concentration is comparatively small. Therefore, the crystallinity becomes higher, and the PN junction having small leak current is formed. On the other hand, in the ending of the step, the impurity concentration is set to be higher, so that the sheet resistance of the embedded layer becomes low, and the contact resistance of the electrode becomes small. Thus, the switching speed of the power device becomes smaller.

Preferably, the semiconductor substrate has a (0001)-Si surface or a (000-1)-C surface. When the substrate has the above surface orientation, for example, even if the slanting angle of the trench is not equal to 90 degrees, the ratio of the carbon atoms and the ratio of the silicon atoms disposed on the surface portion of the sidewall of the trench can be almost the same. When the growth atmosphere is constant, the retrieve ratio of the impurity is decided by the ratio between the carbon atoms and the silicon atoms disposed on the surface. Therefore, the parameters of the semiconductor device can be easily determined.

Preferably, the step of forming the trench is performed in such a manner that a surface pattern of the trench becomes a stripe pattern, in which the pattern of the trench is parallel to an offset direction of the semiconductor substrate.

Thus, since the trench pattern becomes parallel to the offset direction of the substrate so that the trench pattern has the stripe pattern, the epitaxial film formed on both sidewalls in the trench becomes completely symmetric in shape and an impurity profile. Thus, the electric characteristics such as threshold voltage of the semiconductor device is uniformed. Further, the C-surface facet is prevented from generating from the upper corner of the trench. Thus, the device having excellent on-off performance is provided.

Preferably, the step of forming the trench is performed in such a manner that a surface pattern of the trench becomes a hexagonal pattern, all inner angles of which are the same.

When the trench pattern has the above pattern, the epitaxial film formed on the sidewall of the trench has uniform shape and uniform impurity concentration profile substantially. Accordingly, the density at the channel width of the transistor becomes maximum. Further, the device having excellent on-off performance is provided, similar to the device having the stripe trench pattern.

BRIEF DESCRIPTION OF THE DRAWINGS

The above and other objects, features and advantages of the present invention will become more apparent from the following detailed description made with reference to the accompanying drawings. In the drawings:

FIGS. 8A and 8B are schematic cross sectional views explaining a prospect growth mode in a case where a substrate temperature is high, and a trench having a sidewall of a-surface is formed on a (0001)-Si surface, according to the preliminary study of the present invention;

FIG. 9 is a chart explaining a result of an embedded shape in a case where an embedding growth is performed in such a manner that a growth temperature and a raw material gas supply amount (i.e., a substantial growth rate) are changed, according to the preliminary study of the present invention;

FIGS. 20A to 20E are cross sectional views explaining a method for manufacturing a semiconductor device according to a tenth embodiment of the present invention;

FIG. 24 is a chart explaining a result of an embedded shape in a case where an embedding growth is performed in such a manner that a growth temperature and a raw material gas supply amount (i.e., a substantial growth rate) are changed, according to the preliminary study of the present invention.

DETAILED DESCRIPTION OF THE PREFERRED EMBODIMENTS

The inventors have preliminarily studied about a semiconductor device having a trench in a silicon carbide semiconductor substrate. In this device, the trench inclination angle is approximately 50 degrees, and the sample owns various sorts of trench widths, the aspect ratios of which are equal to or smaller than 1, such experiments have been carried out. That is, the epitaxial growing processes have been performed under such a condition that growth temperatures are 1480° C. and 1620° C., and C/Si ratios are 1.2 and 4.0.

Figure 7A:
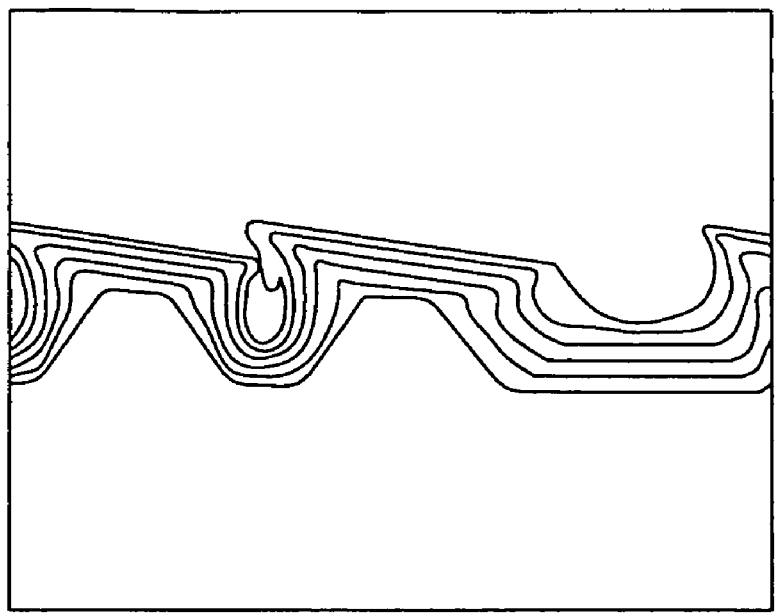
FIGS. 7A and 7B are schematic cross sectional views showing growth shapes of an epitaxial layer according to the preliminary study of the present invention.
Figure 7B:
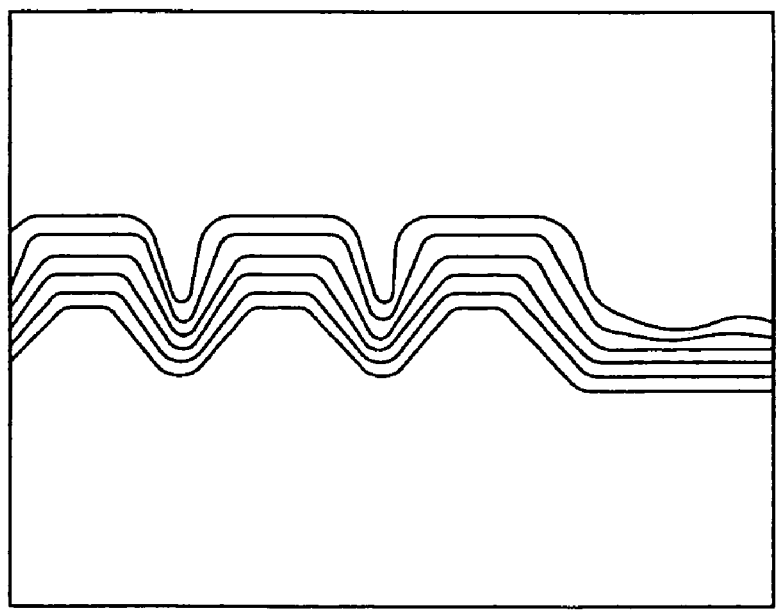

FIG. 7A and FIG. 7B represent one example as to growth shapes of epitaxial layers. As easily understood from FIG. 7A and FIG. 7B, while the growth shapes of the epitaxial layers may strongly depend upon the C/Si ratios rather than the growth temperatures, in such a case that the C/Si ratio becomes low, the growth mode of the epitaxial layer becomes the surface reaction rate controlling, and thus, becomes the facet plane growth in which a plurality of facet faces appear, whereas in the case that the C/Si ratio is high, the growth mode of the epitaxial layer becomes the vapor phase diffusion rate controlling.

Specifically, the below-mentioned problem is provided as to the embedding process of the trench in which the subject inclination angle is vertical and the aspect ratio is high. Namely, under the condition of the high C/Si ratio, since the supply of the material gas into the trench is decreased, as compared with that of the non-trench portion, when the N type channel layer is formed, the shape thereof is brought into such an overhang state as represented in FIG. 7A, whereas when the P+ type gate region is formed, the cavity is produced in the trench. In addition, as shown in FIG. 7B, since the growth rate of the trench inner portion is necessarily lower than that of the non-trench portion, even when the P+ type gate region could be embedded without an occurrence of such a cavity, there is another problem that the removing film thickness of the unnecessary epitaxial film in the etch-back step after the embedding step may surely become larger than the depth of the trench.

In order to achieve the above-described object, first of all, the inventors of the present invention have considered problems in such a case that the manufacturing method of the silicon carbide semiconductor device is applied to a trench shape of a hydrogen etching process.

As previously explained, as the embedding growth preprocess, the corner portion of the trench bottom portion must be rounded. To this end, it is required that the etching reaction is set to the vapor phase diffusion rate controlling, and the surface reaction rate controlling by which the facet planes appear must be suppressed. A plurality of facet planes appears in accordance with a difference in surface energy of the respective crystal faces in such a case that reaction products which are produced in an etching reaction are sufficiently diffused (exhausted), and further, a reaction temperature is relatively low. When such a condition occurs under which these facet faces are produced, the etching reaction mode becomes the surface reaction rate controlling. As a consequence, in order that this etching reaction mode is set to the vapor phase diffusion rate controlling, the reaction temperature is increased in order to be sufficiently reacted even in any of the face orientation, and/or the pressure are increased in order to suppress the diffusion of the reaction products.

Figure 3:
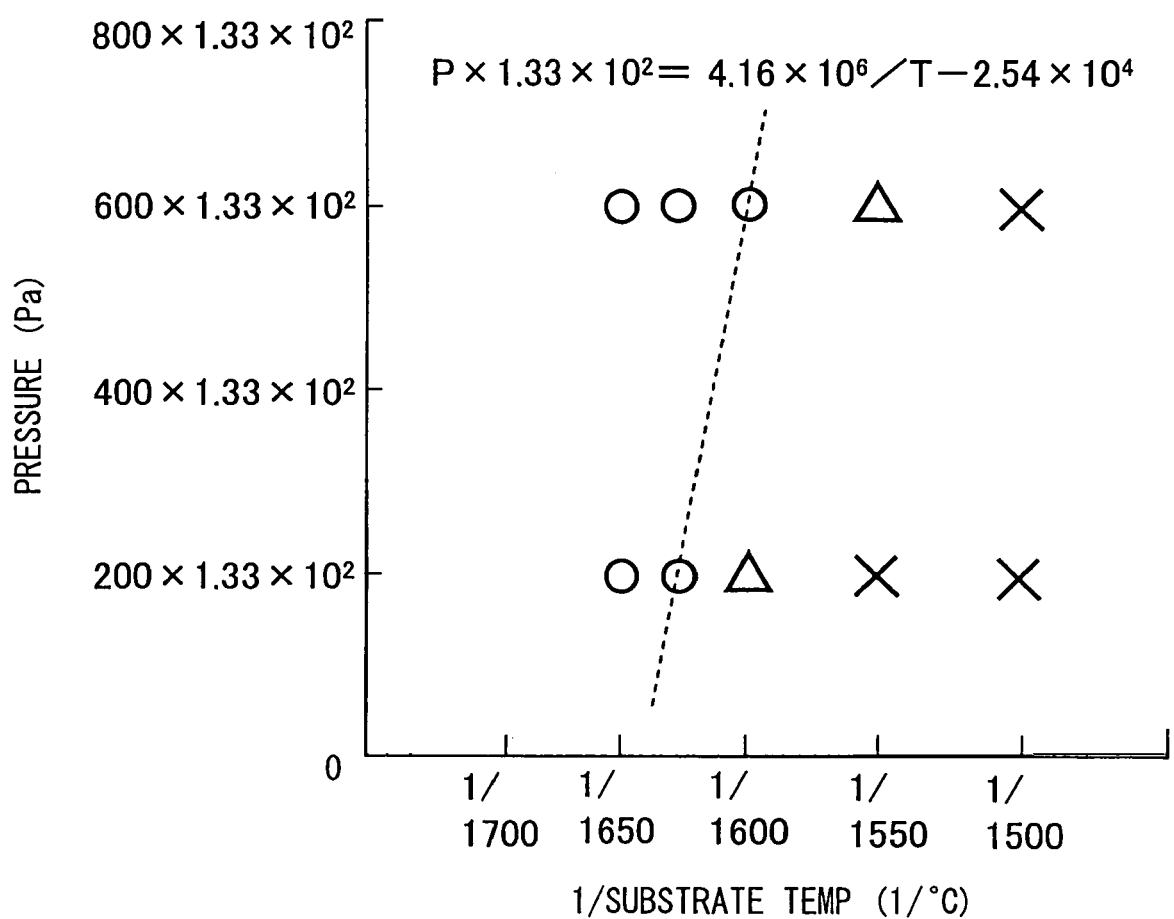
FIG. 3 is a graph showing an etching reaction state on the basis of a relationship between a substrate temperature and a pressure, according to a preliminary study of the present invention.
Figures 16, 18:
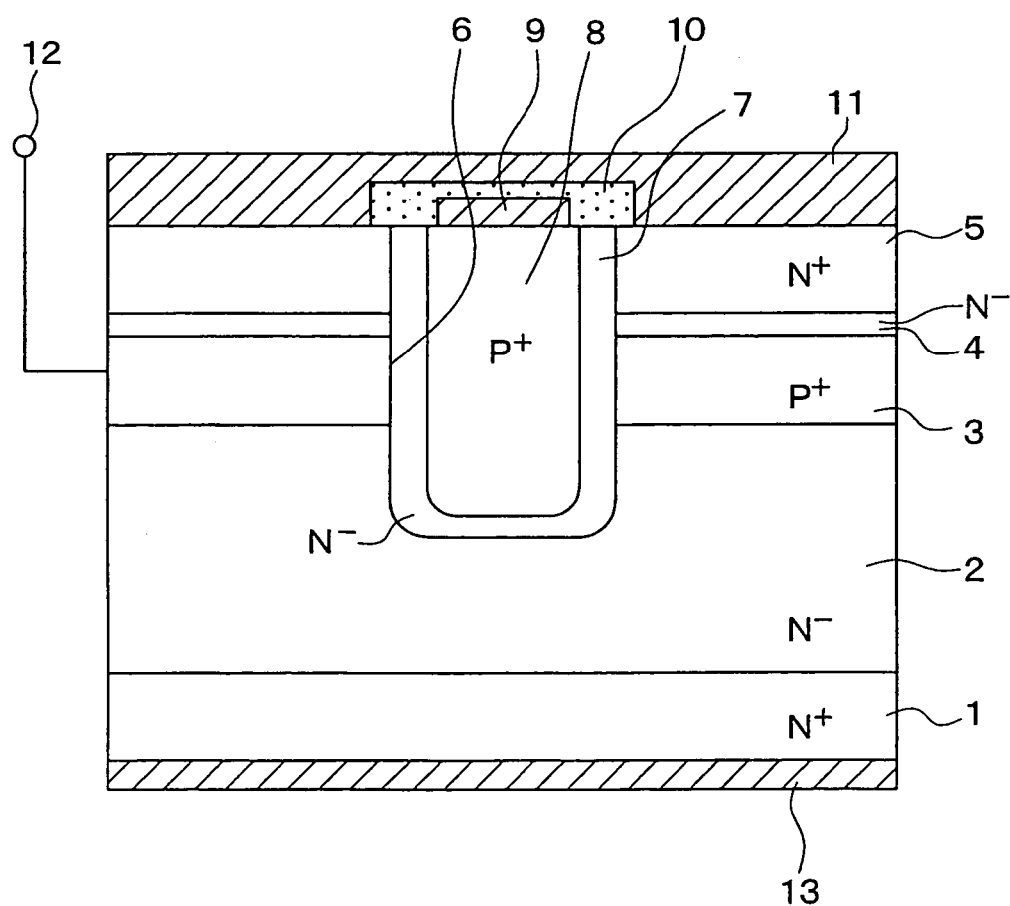
FIG. 16 is a graph explaining a result of etching in a case where the substrate temperature is in a range between 1500° C. and 1650° C., and the pressure is $2.7 \times 10^4$ Pa (i.e., 200 Torr) or $8.6 \times 10^4$ Pa (i.e., 600 Torr), according to the preliminary study of the present invention.
FIG. 18 is a cross sectional view showing a semiconductor device according to a ninth embodiment of the present invention.

As a consequence, the inventors performed an experiment of a hydrogen etching process while employing such a sample that a trench shape had been formed in an actual (0001) Si-face silicon carbide substrate. At this time, a temperature of this silicon carbide substrate was selected to be 1500 to 1650° C., and pressure was selected to be $2.7 \times 10^4$ Pa (200 Torr) and $8.6 \times 10^4$ Pa (600 Torr). FIGS. 3 and 16 are a diagram and a graph for indicating results of this experiment. In FIG. 16, a circle, i.e., "O" represents a vapor phase diffusion rate control condition, a triangle, i.e., "Δ" represents a slightly surface reaction rate control condition, and a cross, i.e., "X" represents a surface reaction rate control condition.

As indicated in this drawing, at the temperatures equal to or higher than 1625° C., the corner portion could be rounded under any of the above-described pressure values. On the other hand, at the temperature of 1500° C., a facet face appeared even under any of the pressure values. In other words, the inventors could find out such a fact that the substrate temperature equal to or higher than 1625° C. is required as the hydrogen etching condition before the embedding process in silicon carbide. Also, the inventors could reveal that no facet face appears even at the temperature of 1600° C. under the pressure of 8.6×10$^4$ Pa (600 Torr).

Also, the inventors could reveal from another experiment that as the face orientation anisotropy of the etching rates, the etching rates become large in this order of an "Si" face, an "a" face, and a "C" face even under any condition. This fact is conceived from that while a ratio of Si atoms to C atoms on the substrate surface determines an etching rate, a removing stage of the Si atoms corresponds to a rate controlling stage.

Next, the inventors considered both problems that an embedding shape is brought into an overhang state in an initial stage and that a cavity is produced in a final stage, and also, another problem that a growth rate of a trench inner portion is lowered, as compared with that of a non-trench portion.

First, in the case that a growth reaction corresponds to the surface reaction rate controlling (corresponds to low C/Si ratio condition in Materials Science Forum P131–134, Vols. 264–268, 1988), i.e., in the case that the growth reaction is performed at a comparatively low temperature and the raw material gas is sufficiently supplied, since a growth rate is determined by crystal face orientation, it becomes a very effective means when a growth rate of a trench side plane is larger than that of a trench bottom plane. As previously explained, it should be understood that the region where the growth of the specific planes is joined to each other is gradually decreased because of the surface reaction rate controlling. As a result, there are some possibilities that since the stress is produced, the embedding layer having the superior crystalline cannot be finally formed.

Then, in the case that the growth reaction corresponds to the vapor phase diffusion rate controlling (corresponds to high C/Si ratio condition in Materials Science Forum P131–134, Vols. 264–268, 1988), i.e., in the case that the growth reaction is performed at a comparatively high temperature and the raw material gas is sufficiently supplied, since a supply of material gas to an inner portion of a trench, especially to the trench bottom portion, is necessarily lower than that for the non-trench portion, such a problem may occur, namely, occurences of an overhang state and an cavity, and a film thickness of the non-trench portion is increased.

The inventors assume two hypotheses for solving a problem concerning to the vapor phase diffusion rate control. One is to balance between the deposition amount and the etching amount, and the other is to activate the migration of the gas, which contributes to the growth.

The hypothesis of the balance between the deposition amount and the etching amount is described as follows.

While growth of an epitaxial film is a reversible reaction, an essential growth amount is determined based upon a balance between a deposition and an etching. In other words, while such a value obtained by subtracting an etching amount from a deposition amount corresponds to an essential growth amount, when the subtracted value becomes plus, then a growth process is carried out, whereas the subtracted value becomes minus, then an etching process is carried out. In general growth, since an etching amount is negligibly small as compared with a deposition amount, this deposition amount is directly regarded as a growth amount. Under such a circumstance, in the case that both a deposition and an etching are activated, namely a temperature of a substrate is increased, the inventors investigated how these relationship behaves.

Figure 17A:
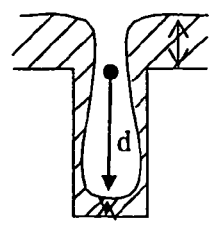
FIGS. 17A, 17C, 17E and 17G are cross sectional views showing different epitaxial growths in the trench in a case where the epitaxial growth is performed with small or large amount of gas supply at a low or high temperature region such as 1550° C. or 1625° C.
Figure 17E:
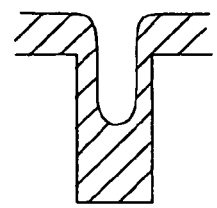
Figure 17B:
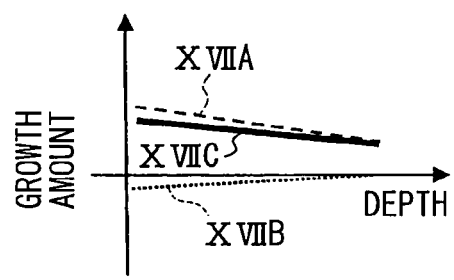
FIGS. 17B, 17D, 17F and 17H are graphs showing a relationship between the growth amount and the depth in the trench, according to the preliminary study of the present invention.
Figure 17F:
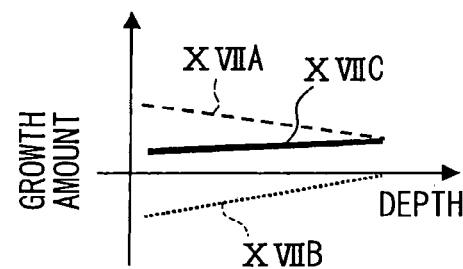
Figure 17C:
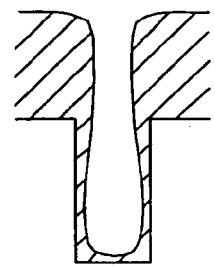
Figure 17G:
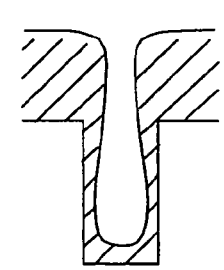
Figure 17D:
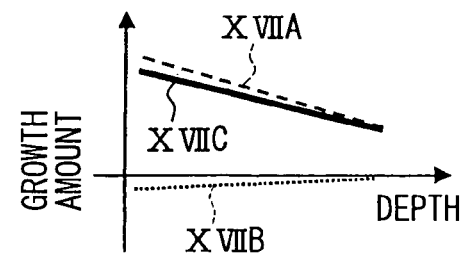
Figure 17H:
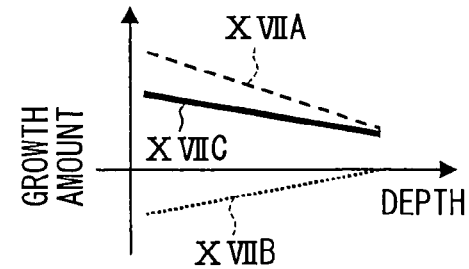

FIG. 17A to FIG. 17H are conceptional diagrams for representing a relationship between deposition amounts and etching amounts in the case of a low temperature range at approximately 1550° C., and in the case of a high temperature range at temperatures higher than, or equal to 1625° C. FIG. 17A shows epitaxial growth in the trench in a case where the epitaxial growth is performed with small amount of gas supply (a growth rate is about 2.5 μm ) at a low temperature region such as 1550° C. FIG. 17B shows a relationship between the growth amount and the depth in the trench, and the epitaxial growth is performed under the condition same as FIG. 17A. In FIG. 17B, XVIIA represents a deposition amount, XVIIB represents an etching amount, and XVIIC represents a practical growth amount, which is obtained by subtracting the etching amount from the deposition amount. FIG. 17C shows epitaxial growth in the trench in a case where the epitaxial growth is performed with large amount of gas supply (a growth rate is about 5 μm) at a low temperature region such as 1550° C. FIG. 17D shows a relationship between the growth amount and the depth in the trench, and the epitaxial growth is performed under the condition same as FIG. 17C. FIG. 17E shows epitaxial growth in the trench in a case where the epitaxial growth is performed with small amount of gas supply (a growth rate is about 2.5 μm ) at a high temperature region such as 1625° C. FIG. 17F shows a relationship between the growth amount and the depth in the trench, and the epitaxial growth is performed under the condition same as FIG. 17E. FIG. 17G shows epitaxial growth in the trench in a case where the epitaxial growth is performed with large amount of gas supply (a growth rate is about 5 μm ) at a high temperature region such as 1625° C. FIG. 17H shows a relationship between the growth amount and the depth in the trench, and the epitaxial growth is performed under the condition same as FIG. 17G. In this case, the conceptional diagram show the respective relationships between the deposition amounts and the etching amounts in such a case that a supply amount of gas which is used in epitaxial growth has been switched to a large gas supply amount and a small gas supply amount.

As represented in FIG. 17, in the case that the epitaxial growth is performed in the normal low temperature range, since the etching amount is considerably smaller than the deposition amount, the essential growth amount becomes substantially equal to the deposition amount, so that the above-described problems cannot be solved. On the other hand, in the case that the epitaxial growth is carried out in the high temperature range, namely, when the deposition amount becomes equivalent to the etching amount, the trench depth depending characteristic of the deposition amount is different from the trench depth depending characteristic of the etching amount. Thus, there are some possibilities that the essential growth amount of the trench bottom may become larger than that of the non-trench portion. In this latter case, it is conceivable to solve the above-described problems.

The other technical idea as to the activation of the migration of the gas seed is given as follows: That is, generally speaking, in epitaxial growth, firstly, a gas seed is absorbed on a surface of a substrate, and subsequently, migration of the absorbed gas seed is carried out in accordance with thermal energy, and then, this gas seed is grown at an optimum position. Then, this migration distance depends upon a temperature of the substrate, concaves/convexes of the substrate surface, and a material gas supply amount. The higher the substrate temperature is increased, the longer the migration distance becomes. The smaller the concaves/convexes of the surface become, the longer the migration distance becomes. The smaller the material gas supply amount becomes, the longer the migration distance becomes.

As a consequence, when a damage removing step is carried out in a high temperature hydrogen atomosphere before the epitaxial growth, a corner portion of a trench opening portion is rounded, so that not only a penetration of the material gas into the trench may be effectively quickened, but also the concaves/convexes of the trench side plane and the concaves/convexes of the corner portion of the trench opening portion may be decreaed on the order of atoms. As a result, such an effect capable of prolonging the migration distance during the epitaxial growth may be obtained. In other words, stopping of the gas seed in the trench opening portion may be suppressed, and also, the growth within the trench may be increased.

In addition, if the substrate temperature during the epitaxial growth is increased, then the migration distance may be further prolonged, and the growth within the trench can be quickened. Also, the inventors could consider in view of the migration distance that the smaller the material gas supply amount becomes, the better the embedding characteristic may become. That is to say, the inventors could have such a technical idea. The damage is removed in the high temperature hydrogen atmosphere; the epitaxial growth is performed at the high temperature; and also, the material gas supply amount is restricted, so that the migration distance may be prolonged. The epitaxial growth in the trench opening portion may be decreased. The growth within the trench may be increased. As a result, the occurrences of the overhang shape and of the cavity in the prior art can be prevented.

Further, while growth of an epitaxial film is a reversible reaction, an essential growth amount is determined based upon a balance between a deposition and an etching. In other words, while such a value obtained by subtracting an etching amount from a deposition amount corresponds to an essential growth amount, when the subtracted value becomes plus, then a growth process is carried out, whereas the subtracted value becomes minus, then an etching process is carried out. In general growth, since an etching amount is negligibly small as compared with a deposition amount, this deposition amount is directly regarded as a growth amount. Under such a circumstance, in the case that both a deposition and an etching are activated, namely a temperature of a substrate is increased, the inventors investigated how these-relationship behaves.

FIG. 8A and FIG. 8B are conceptional diagrams for representing predicted growth modes in such a case that a trench is formed in a (0001) Si face, a side plane is defined as an "a" face, and a substrate temperature is increased. VIIIA represents a region to be etched by hydrogen, VIIIB represents a portion affected by the hydrogen etching, and VIIIC represents an epitaxial growth portion (i.e., a shadow area).

First, FIG. 8A indicates a shape obtained by an $H_2$ etching process when material gas ($SiH_4$, $C_3H_8$) is not added to carrier gas ($H_2$). Due to the face orientation anisotropy of the above-described $H_2$ etching process, the etching rate as to the side plane of the trench 100 is higher than the etching rates as to the bottom plane of the trench 100 and the non-trench portion, the resulting shape is obtained by selectively etching the side plane of the trench 100. Also, the corner portion of the trench 100 is rounded due to the effect of the vapor phase diffusion rate controlling.

On the other hand, FIG. 8B indicates a growth shape obtained when material gas ($SiH_4$, $C_3H_8$) is added to carrier gas ($H_2$). In this case, the growth is strongly influenced by the face orientation anisotropy of the above-described $H_2$ etching process, so that the growth rate of the "a" face becomes lower than that of the Si face. As a result, as the growth rates, it is predictable that the growth rate is increased in this order of the upper side plane of the trench 100, the lower side plane of the trench 100, the non-trench portion, and the bottom portion of the trench 100.

Then, when this growth rate is realized, then the inventors can consider that the below-mentioned problems can be solved. That is, as the problem, the embedding shape is brought into the overhang state in the initial stage, and the cavity is produced in the final stage. Also, as the problem, the growth rate of the trench inner portion becomes smaller than that of the non-trench portion. These problems can be solved. Thus, the inventors performed a confirmation experiment in the below-mentioned manner.

While the inventors of the present invention employed such a sample that a trench shape had been formed in an actual silicon carbide substrate, and also, both a growth temperature and a material gas supply amount (essential growth rate) were changed as a growth parameter, embedding growth process was carried out. At this time, a hydrogen etching process before the embedding growth process was carried out under such a condition at a temperature of 1625° C. and pressure of $2.7 \times 10^4$ Pa (200 Torr).

Figure 10A:
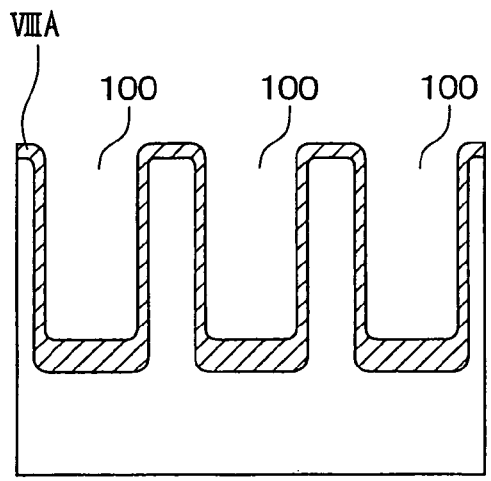
FIGS. 10A to 10C are cross sectional views explaining a time dependence of the growth shape in a case where the growth temperature is 1625° C., and the growth rate is about 2.5 μm , according to the preliminary study of the present invention.
Figure 10B:
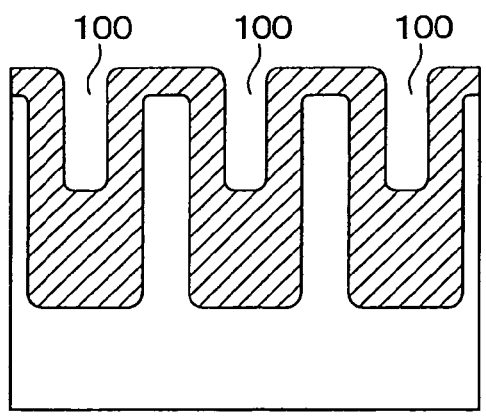
Figure 10C:
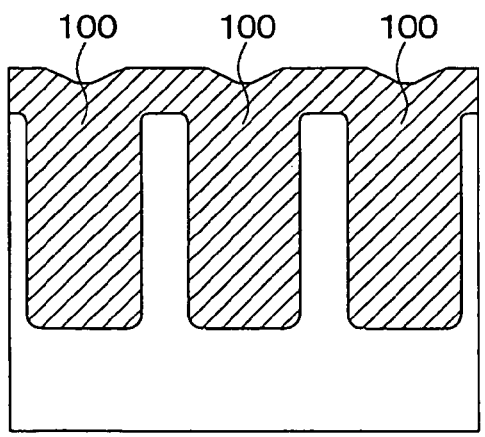

FIG. 9 shows results of this experiment. In FIG. 9, a circle, i.e., "O" represents a condition that no cavity is formed, and a cross, i.e., "X" represents a condition that a cavity is formed. As a result, in such a sample that the growth temperature was equal to or higher than 1625° C., and also, the growth rate was approximately 2.5 µm or less, the above-described problems could be solved. In other words, the sample was not brought into the overhang state in the initial stage, but also, the cavity did not occur in the final stage. Also, FIG. 10A, FIG. 10B, and FIG. 10C show temporal changes in growth shapes in the case that the growth temperature is 1625° C., and the growth rate is approximately 2.5 µm. FIG. 10A shows a condition that a 10 minutes growth is performed, FIG. 10B shows a condition that a 30 minutes growth is performed, and FIG. 10C shows a condition that a 60 minutes growth is performed. VIII represents an epitaxial growth portion (i.e., a shaded area). The growth rate is increased in this order of the upper side plane of the trench 100, the lower side plane of the trench 100, the non-trench portion, and the bottom portion of the trench 100. In other words, the growth rate of the inner portion of the trench 100 is also be increased, as compared with that of the non-trench portion. This fact is not contradictory to such a conclusion which is conducted from such a fact that the etching rate of the "a" face is larger than that of the Si face.

Figure 23A:
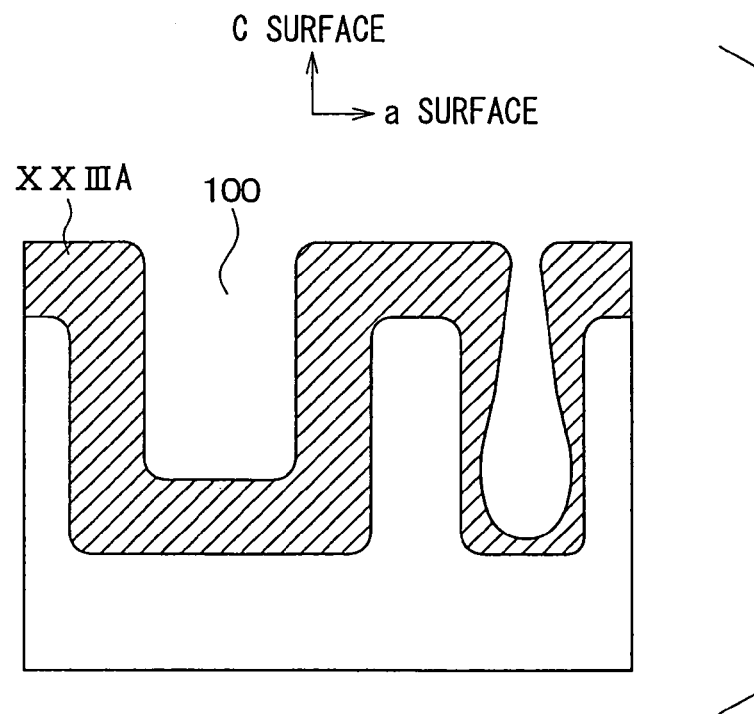
FIGS. 23A and 23B are schematic cross sectional views explaining a prospect growth mode in a case where a trench having a sidewall of a-surface is formed on a (000-1)-C surface, according to the preliminary study of the present invention.
Figure 23B:
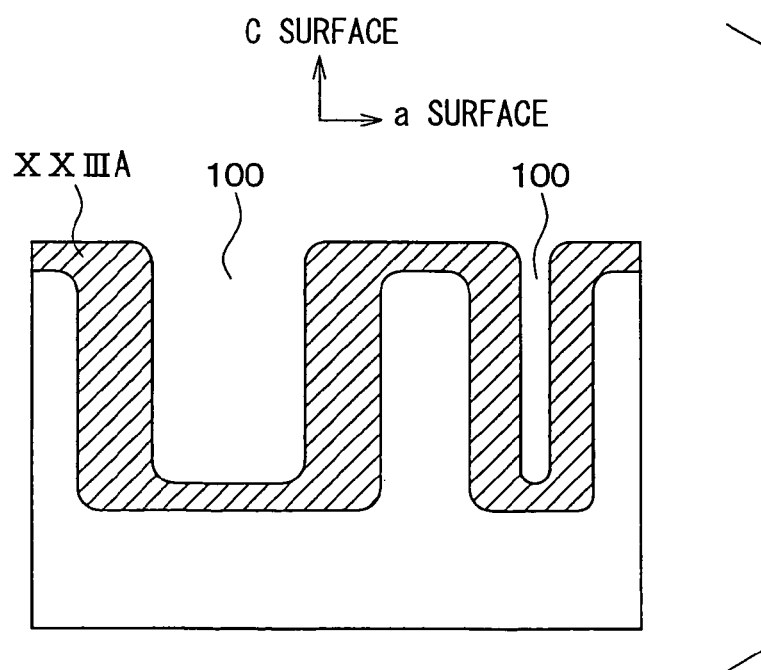

FIG. 23A and FIG. 23B are conceptional diagrams for showing predicted growth modes in the case that trenches 100 are formed in "(000-1) C" faces, and side surfaces are determined as "a" faces. XXIIIA represents an epitaxial growth portion (i.e., a shaded area). FIG. 23A indicates a growth shape in the case of general material supply rate controlling (vapor phase diffusion rate controlling). Normally, this growth shape may be realized at a growth temperature of approximately 1550° C. and in a growth rate of approximately 2.5 μm/h.

Now, if the temperature of the epitaxial growth is further increased (namely, vapor phase diffusion rate controlling is emphasized), then the above-described face azimuth anisotropy of the hydrogen etching is strongly effected. In other words, such a condition that the etching rate of the "C" face is large than the etching rate of the "a" face may give an influence, so that the growth rate of the "a" face becomes large, as compared with the growth rate of the "C" face, and thus, the growth shape shown in FIG. 23B may be realized. In this case, the growth of the trench side face becomes the highest speed, and thus, the occurrence of the overhang state at the initial stage may be suppressed, and also, the occurrence of the cavity at the final stage may be suppressed. In this case, not a few flattening effects caused by the etching process may be given, so that blocking of the opening portions of the trenches 100 may be prevented. Further, when the embedding process is accomplished, the growth film thickness of the non-trench forming portion becomes small, as compared with the depth of the trench portion due to the face azimuth anisotropy of the growth rate. As a result, the removed film thickness of the unnecessary epitaxial film in the etch-back step after the embedding process may be decreased.

While the inventors of the present invention employed such a sample that a trench shape had been formed in an actual (000-1) C face silicon carbide substrate, and also, both a growth temperature and a material gas supply amount (essential growth rate) were changed as a growth parameter, embedding growth process was carried out. At this time, a hydrogen etching process before the embedding growth process was carried out under such a condition at a temperature of 1625° C. and pressure of $2.7 \times 10^4$ Pa (200 Torr).

FIG. 24 shows results of this experiment. As a result, in such a sample that the growth temperature was equal to or higher than 1625° C., and also, the growth rate was approximately 2.5 μm or less, the above-described problems could be solved. In other words, the sample was not brought into the overhang state in the initial stage, but also, the cavity did not occur in the final stage. The growth rate is increased in this order of the non-trench portion, the bottom portion of the trench 100, the upper side plane of the trench 100, and the lower side plane of the trench 100. In other words, after the embedding process is finished, the growth thickness of the non-trench portion can be smaller than the depth of the trench.

First Embodiment

Figure 1:
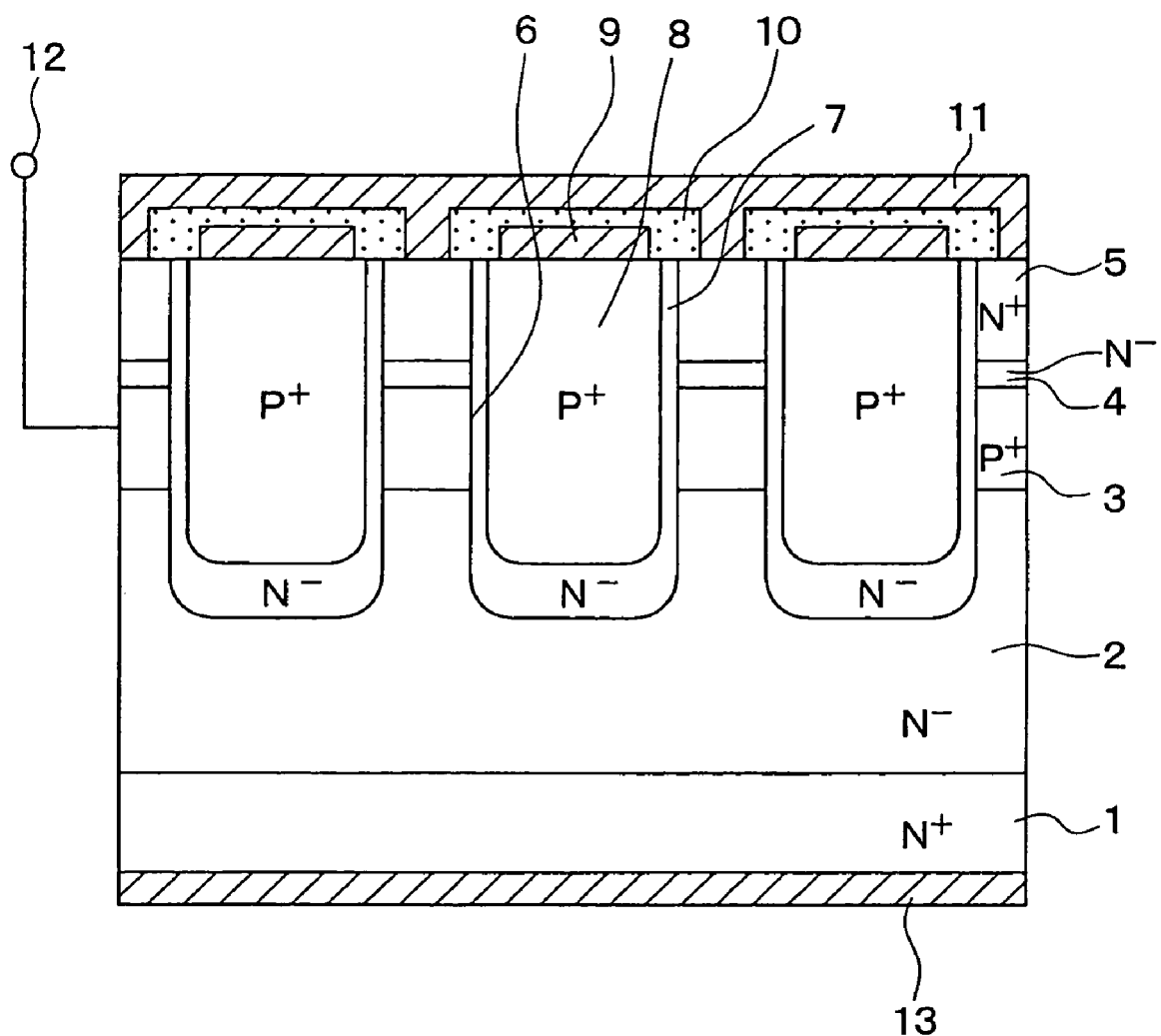
FIG. 1 is a cross sectional view showing a semiconductor device according to a first embodiment of the present invention.

FIG. 1 shows a sectional structure of a J-FET provided in a silicon carbide semiconductor device according to a first embodiment of the present invention. The structure of the J-FET will now be described with reference to FIG. 1.

As indicated in FIG. 1, while an N⁺ type substrate 1 having a silicon carbide "(0001) Si" face has been employed and this N⁺ type substrate 1 is made in high impurity concentration equal to or higher than, for instance, $1 \times 10^{19}$ cm⁻³, an N⁻ type drift layer 2 has been formed on a major surface of this N⁺ type substrate 1, and this N⁻ type drift layer 2 is made in low impurity concentration of, for example, $1 \times 10^{13}$ to $5 \times 10^{15}$ cm⁻³. Also, a first gate region 3 made of a P⁺ type layer has been epitaxial-grown on the surface of the N⁻ type drift layer 2. This first gate region 3 is made in high impurity concentration of, for example, $5 \times 10^{17}$ to $5 \times 10^{19}$ cm⁻³.

Further, an N⁻ type region 4 has been epitaxial-grown on the surface of the first gate region 3. Also, an N⁺ type source region 5 has been epitaxial-grown on the surface of the N⁻ type region 4, while the N⁺ type source region 5 is made in high impurity concentration of, for example, $1 \times 10^{18}$ to $5 \times 10^{19}$ cm⁻³. Since the N⁻ type region 4 is sandwiched between the N⁺ type source region 5 and p⁺ type first gate region 3, this N⁻ type region 4 relaxes an electric field between PN junctions having high concentration. The N⁻ type region 4 will be referred to as an "electric field relaxing region (first electric field relaxing region)" hereinafter. A thickness of this electric field relaxing region 4 is made smaller than, or equal to, for instance, 0.5 μm, and impurity concentration thereof is made lower than that of the N⁺ type source region 5.

Also, a trench 6 has been formed in such a manner that this trench 6 penetrates from the surface of the N⁺ type source region 5, through the electric field relaxing region 4, and the first gate region 3, and then, is reached to the N⁻ type drift region 2. An N⁻ type channel layer 7 made in impurity concentration substantially equal to that of the N⁻ type drift region 2 has been epitaxial-grown on an inner wall of this trench 6. A P⁺ type of second gate region 8 made in impurity concentration substantially equal to that of the first gate region 3 has been epitaxial-grown on the surface of this N⁻ type channel layer 7 in such a manner that the trench 6 is embedded. The surface of the N⁻ type channel layer 7 and the surface of the second gate region 8 constitute the same plane as the surface of the N⁺ type source region 5.

While a second gate electrode 9 has been electrically connected to the surface of the second gate region 8, an interlayer insulating film 10 has been formed in such a manner that this interlayer insulating film 10 covers the second gate electrode 9. Also, a source electrode 11 has been formed which is electrically connected to the N⁺ type source region 5 via a contact hole formed in the interlayer insulating film 10.

Also, as shown in a sectional view other than FIG. 1, while the first gate region 3 is also electrically connected to the first gate electrode 12, a voltage applied to the first gate region 3 via the first gate electrode 12 is controlled. Then, while a drain electrode 13 has been formed on the side of a rear surface of the N⁺ type substrate 1, the semiconductor structure shown in FIG. 1 has been constructed.

The J-FET which has been constructed in the above-explained manner is operated in a normally off mode. This operation differs from each other, depending upon connection modes of the first gate electrode 12 and the second gate electrode 9, and the operation is carried out in the below-mentioned manner.

In such a mode that potentials at the first gate electrode 12 and the second gate electrode 9 can be controlled, a double gate drive is carried out which controls an extension amount of depletion layers which are extended from both of the first and second gate regions 3 and 8 to the side of the N⁻ type channel layer 7 based upon the potentials of the first and second gate electrodes 12 and 9. For instance, when no voltage is applied to the first and second electrodes 12 and 9, the N⁻ type channel layer 7 is pinched off by the depletion layers which are extended from the first and second gate regions 3 and 8. As a result, a current between the source and the drain is turned off. Then, when a forward bias voltage is applied between the first and second gate regions 3, 8, and the N⁻ type channel layer 7, the extension amount of the depletion layers which are extended to the N⁻ type channel layer 7 is reduced. As a result, a channel is set, and a current flows between the source and the drain.

In such a mode that only the potential of the first gate electrode 12 is independently controllable, and the potential of the second gate electrode 9 is equal to, for example, the potential of the source electrode 11, a single gate drive is carried out which controls the extension amount of the depletion layer. This depletion layer is extended from the side of the first gate region 3 to the side of the N⁻ type channel layer 7 based upon the potential of the first gate electrode 12. Also, in this single gate drive case, a similar operation is basically carried out in the case of the double gate drive. However, a channel setting operation is performed only by the depletion layer extended from the side of the first gate region 3.

In such a mode that only the potential of the second gate electrode 9 is independently controllable, and the potential of the first gate electrode 12 is equal to, for example, the potential of the source electrode 11, a single gate drive is carried out which controls the extension amount of the depletion layer. This depletion layer is extended from the side of the second gate region 9 to the side of the N⁻ type channel layer 7 based upon the potential of the second gate electrode 9. Also, in this single gate drive case, a similar operation is basically carried out in the case of the double gate drive. However, a channel setting operation is performed only by the depletion layer extended from the side of the second gate region 9.

Next, a method of manufacturing the silicon carbide semiconductor device shown in FIG. 1 will now be described with reference to manufacturing steps for the silicon carbide semiconductor device indicated in FIGS. 2A to 2F.

Figure 2A:
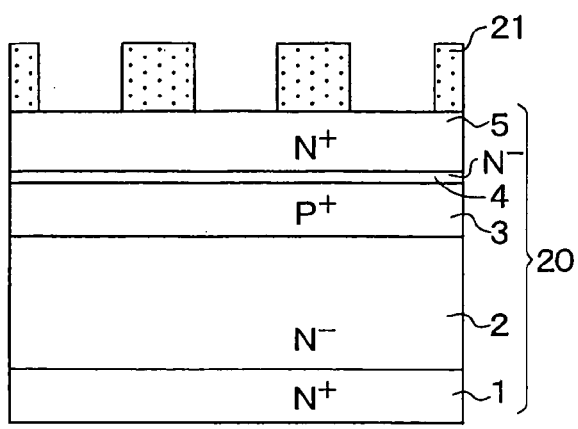
FIGS. 2A to 2F are cross sectional views explaining a method for manufacturing the semiconductor device shown in FIG. 1, according to the first embodiment.

[Manufacturing Step Shown in FIG. 2A]

First, the N⁺ type substrate 1 having the silicon carbide "(0001) Si" face is prepared. When the substrate 1 having such a face orientation is employed, even when the inclination angle of the trench 6 is not equal to, for example, 90 degrees, ratios of carbon atoms to silicon atoms, which are present on the surfaces of the side planes of the trench 6, is made substantially equal to each other. As a consequence, parameters of the semiconductor device can be easily designed.

Then, a semiconductor substrate 20 made of silicon carbide is prepared in which the N⁻ type drift layer 2, the P⁺ type first gate region 3, the N⁻ type region 4, and the N⁺ type source region 5 have been sequentially stacked on the N⁺ type substrate 1 having such a face orientation. The N⁻ type drift layer 2, the P⁺ type first gate region 3, the N⁻ type region 4, and the N⁺ type source region 5 are made of the epitaxial films. An LTO film (oxide film) 21 which will become a mask for a trench etching process is formed on an upper plane of this semiconductor substrate 20, and thereafter, the resulting semiconductor substrate 20 is patterned by way of a photolithography. As a pattern, such a stripe pattern is set in which a longitudinal direction of this opening portion is located parallel to the off direction of the substrate 20; a width (trench width) of the opening portion is set to, for example, 2 μm; and a distance between the trench patterns is set to, for instance, 1.5 μm.

When the trench patterns are set as the stripe patterns which are located parallel to the off direction of the semiconductor substrate 20, then the crystal faces of both the side planes completely becomes symmetrical in view of the crystal face orientation. Furthermore, as will be explained later, during epitaxial growth, it is possible to avoid forming of a "C" face facet which is produced from a corner portion of an upper portion of the trench 6. As a result, both shapes and impurity profiles as to the epitaxial films which are formed on both the side planes of the trench 6 becomes completely symmetrical with each other, and thus, electric characteristics such as threshold voltages of a semiconductor device can be made uniform. Also, since the "C" face facet is not present on the upper portion of the trench 6, it is also possible to avoid a leak current failure of the semiconductor device.

Figure 2D:
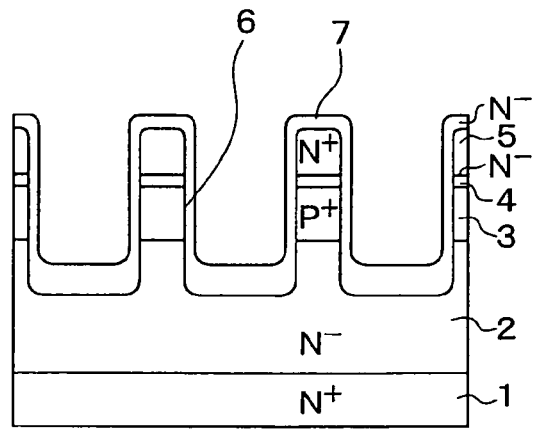
Figure 2B:
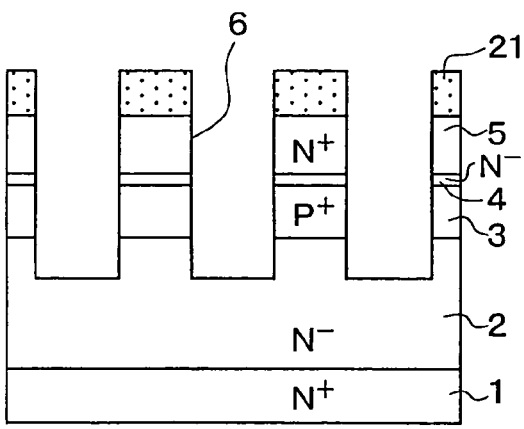

[Manufacturing Step Shown in FIG. 2B]

Next, a dry etching process for forming the trench 6 is carried out while the LTO film is employed as a mask, such a trench 6 is formed which penetrates through the first gate region 3 and is reached to the N⁻ type drift layer 2 under such a condition that an inclination angle thereof is larger than, or equal to 80 degrees; and a depth of the trench 6 is deeper than, or equal to 4 μm , namely, an aspect ratio is larger than, or equal to 2. At this time, due to damages caused by the dry etching process, surface concaves/convexes of on the order of 100 nm are produced on the side planes of the trench 6, and surface concaves/convexes of on the order of 10 nm are produced on the bottom plane of the trench 6. Also, alteration layers having depths of approximately 10 nm have been produced in the side planes and the bottom plane of the trench 6.

Figure 2E:
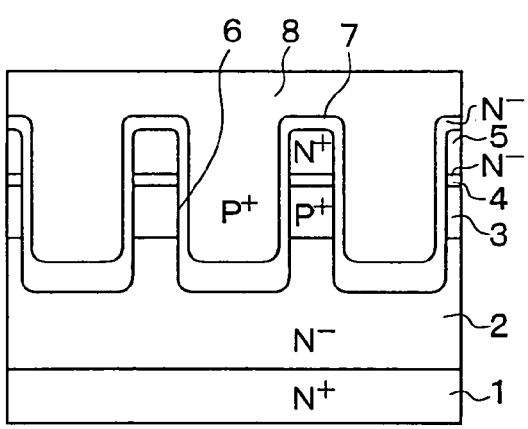
Figure 2C:
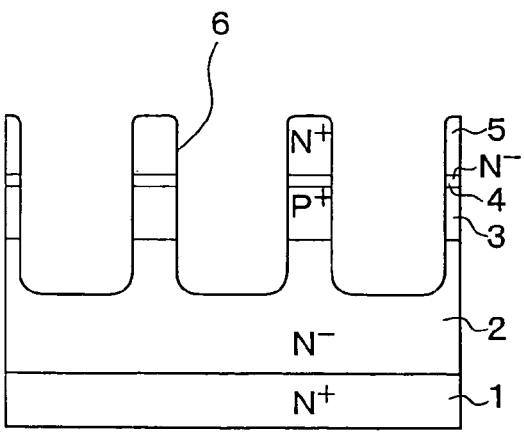

[Manufacturing Step Shown in FIG. 2C]

Next, a damage removing step for the trench etching process is carried out in a high temperature hydrogen atmosphere. Concretely speaking, a condition as to the damage removing step at this time has been determined based upon an experimental result.

That is, assuming now that a temperature of the substrate 1 is defined as "T", an investigation was made of a relationship between an inverse number "(1/T)" of this substrate temperature "T" and pressure "P", and then, such a result shown in FIG. 3 was obtained. In this drawing, symbol "O" indicates such a case that an etching reaction mode becomes vapor phase diffusion rate controlling. Symbol "Δ" indicates such a case that an etching reaction mode is basically vapor phase diffusion rate controlling, but surface reaction rate controlling is slightly contained. Symbol "X" shows such a case that an etching reaction mode becomes surface reaction rate controlling. From this relationship diagram, the following fact can be revealed: When the relationship of the below-mentioned formula can be satisfied, then the etching reaction mode becomes the vapor phase diffusion rate controlling. That is, as a boundary between the substrate temperatures and the pressure in the case that the etching reaction mode becomes the vapor phase diffusion rate controlling, and in the case that the surface reaction rate controlling is contained in the above-described case, a straight line is drawn with respect to the maximum values of the substrate temperature and the pressure in the case that the etching reaction mode becomes the vapor phase diffusion rate controlling, which have been acquired from the experiment result, and then, this straight line is expressed as a liner equation.

$$P \times 1.33 \times 10^2 \geq a/T - b. \qquad \text{(Formula 1)}$$

It should be noted that symbols "a" and "b" indicate constants, namely, a=4.16×10⁶, and b=2.54×10⁴.

As a consequence, in accordance with this first embodiment mode, in a hydrogen atmosphere at a temperature higher than, or equal to 1600° C. under reduced pressure, for instance, in a high temperature hydrogen atmosphere at the temperature of 1625° C. and under 2.7×10⁴ Pa (200 Torr), the damage elimination for the trench etching process is carried out for approximately 5 minutes.

At this time, it should be understood that an upper limit temperature in the damage removing step is set to 1700° C. This reason is given as follows: That is, when the upper limit temperature exceeds 1700° C., there are some possibilities that step punching occurs on the substrate surface. When the upper limit temperature becomes lower than, or equal to 1700° C., then the occurrence of the step bunching can be avoided.

As previously explained, since the damage removing step is carried out for approximately 5 minutes, approximately 20 nm of the side planes of the trench 6 are etched away, and approximately 40 nm of the bottom plane thereof is etched away, so that both the surface concaves/convexes and the alteration layers are completely removed.

Also, at the same time, the LTO film 21 of the mask for the trench etching process is also completely removed. In other words, although the LTO film 21 has been employed as the mask for the trench etching process, an oxide film of a semiconductor grade owns such a feature that this oxide film is easily etched away, and moreover, such a contamination as a metal is not contained. As a consequence, when this feature is utilized, then both the damage removing step using high temperature hydrogen and a trench mask removing step can be executed at the same time. As a result, such a trench mask removing step can be omitted which is conceivable to be required between the trench forming step and the damage removing step with employment of the high temperature hydrogen.

In addition, at this time, the surface concaves/convexes of the trench side planes are also reduced by approximately 5 nm. Under the etching condition at this time, the etching reaction becomes the vapor phase diffusion rate controlling. As a result, such a trench corner portion as a trench opening portion and a trench bottom portion becomes a round shape having no facet plane. In this trench opening portion, this round shape can effectively quicken a penetration of material gas into the trench 6 when an epitaxial film is grown in the next manufacturing step. As a result, it is possible to avoid an occurrence of an overhang shape in the case that the aspect ratio of the trench 6 is set to be high. As a consequence, even when both the N⁻ type channel layer 7 and the P⁺ type of second gate region 8 are formed in the post step, the trench 6 can be embedded by these channel layer 7 and second gate region 8 in order not produce a cavity. On the other hand, since the trench bottom portion owns such an effect capable of distributing a crystal stress produced during the epitaxial growth so as to relax this crystal stress, such an epitaxial film having better crystalline can be formed. In addition, at this time, a length of a plain portion (Si plane portion) between the trench patterns is reduced from 1.5 μm to 1.1 μm by an etching process.

[Manufacturing Step Shown in FIG. 2D]

Next, an N⁻ type channel layer 7 made of an epitaxial thin film is continuously formed in the same semiconductor device as such a semiconductor device that the damage removing step has been carried out. As explained above, since both the damage removing step and the epitaxial thin film forming step are carried out within the same semiconductor device, the semiconductor substrate cannot be exposed in the atmosphere, and depositions of contamination on the surface of the semiconductor substrate can be reduced. Moreover, since temperature ascent/descent time required for heating the substrate can be omitted, manufacturing throughput as to the semiconductor device can be improved.

In this epitaxial growing step, an epitaxial growing process is carried out by conducting both $SiH_4$ gas and $C_3H_8$ gas, which constitute material gas, into a high temperature hydrogen atmosphere higher than, or equal to 1625° C. Then, $N_2$ gas which becomes doping gas is properly used in order to control N type impurity concentration. Also, at this time, it is preferable to set an upper limit temperature of this epitaxial growth to be 1700° C. in order that step bunching does not occur.

Then, a gas flow rate is set in such a manner that the growth rate is lower than, or equal to 2.5 μm/hr. Since the growth rate is set to such a growth rate, the epitaxial growth is progressed by the vapor phase diffusion reaction, and it is possible to avoid that a facet plane appears after the epitaxial growth.

As previously explained, since the epitaxial growth reaction becomes the vapor phase diffusion reaction, such an epitaxial film having better crystalline and less crystal stress distortion can be formed even in the trench corner portion and the trench bottom portion. Also, since both the etching and the deposition are activated, and also, the etching amount is balanced with the deposition amount, the etching process on the side plane ("a" face) is quickened, so that growth modes in which the growth rates are sequentially increased in this order of the trench side plane, the non-trench portion, and the trench bottom plane is realized. At the same time, since the growth rate of the lower portion in the side plane can be larger than the growth rate of the upper portion of this side plane, an occurrence of a so-called "overhang shape" can be suppressed.

Also, since the trench patterns correspond to the stripes which are located parallel to the off direction of the substrate 1, both shapes and impurity profiles as to the epitaxial films which are formed on both the side planes of the trench 6 becomes completely symmetrical with each other, and thus, electric characteristics such as threshold voltages of the semiconductor device can be made uniform. Furthermore, it is also possible to prevent a formation of the "C" face facet plane which is produced from the corner portion of the trench upper portion. As a result, such an element having superior on/off performance can be realized.

[Manufacturing Step Shown in FIG. 2E]

Next, as an embedding layer, a P⁺ type of a second gate region 8 is formed under a similar epitaxial condition to that of the N⁻ type channel layer 7. When the second gate region 8 is formed, a different point from the forming of the N⁻ type channel layer 7 is given as follows. That is, since the type of this second gate region corresponds to a P type, tri-methyl aluminum is employed instead of $N_2$. Also, in this case, as the etching amount is balanced with the deposition amount, the etching process on the side plane ("a" face) is quickened. In particular, in such a stage that the embedding process has been advanced, the plain portion (Si face portion) between the trench patterns completely disappears, so that the growth is further suppressed. As a result, the growth rates are sequentially increased in this order of the trench side plane, the non-trench portion, and the trench bottom plane. Then, also in the trench side plane, since the growth rate of the trench lower portion can be made large, as compared with that of the trench upper portion, the occurrence of the cavity can be avoided. Moreover, a removing amount in an etch-back step after the second gate region 8 has been formed is made smaller than the trench depth.

Furthermore, another concentration control operation is preferably carried out in such a manner that the impurity concentration, namely the P type concentration in the initial stage is different from the impurity concentration in the final stage during the epitaxial growth. Concretely speaking, when the flow rate of tri-methyl aluminum is controlled in such a way that the impurity concentration in the final stage becomes larger than the impurity concentration in the initial stage, the element characteristics is further improved. For example, in the initial stage, the impurity concentration is selected to be $5 \times 10^8$ cm$^{-3}$ and the thickness of the side plane is selected to be 0.2 μm, and thereafter, the trench 6 is embedded in the impurity concentration of $1 \times 10^{20}$ cm$^{-3}$. As a result, in a growth initial layer where a PN junction boundary plane is formed, the impurity concentration becomes relatively low, so that such a PN junction having superior crystalline and a small leak current and also less crystal distortion is formed. On the other hand, in the final stage, the impurity concentration is set to high impurity concentration so as to lower a sheet resistance of an embedding layer and also to decrease a contact resistance with respect to an electrode. A switching speed of a power device can be decreased in the above-explained manner.

Figure 2F:
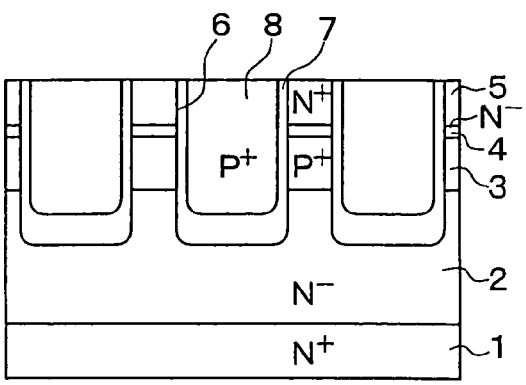

[Manufacturing Step Shown in FIG. 2F]

Next, unnecessary portions of both the N$^-$ type channel layer 7 and the P$^+$ type of the second gate region 8, which have been formed in the non-trench portion, are etched back by way of CMP (Chemical Mechanical Polishing), or the like. Thereafter, an electrode forming step, and the like are carried out in order that both the N$^-$ type channel layer 7 and the P$^+$ type of the second gate region 8 as to the trench-type J-FET represented in FIG. 1 are accomplished. In this case, since the growth rates of the epitaxial are sequentially increased in this order of the trench side plane, the non-trench portion, and the trench bottom plane, the etching amount required for the etching back process can be made smaller than the trench depth, and the control characteristic of the etching amount can also become better.

As previously described, in this first embodiment mode, such a trench 6 that the aspect ratio is larger than, or equal to 2 and the trench inclination angle is higher than, or equal to 80 degrees is formed on the substrate 20 by performing the dry etching process. Thereafter, the damage region of the trench inner plane during the dry etching process is etched to be removed in the reduced pressure hydrogen atmosphere at the temperature higher than, or equal to 1600° C.

In the conventional technique using silicon carbide crystal, the contents as to the wet etching fluid and the dry etching condition are not clear, by which a so-called "trench etching damage region" can be effectively removed. The trench etching damage region is known as the surface concaves/convexes, the alteration layer, and the like, which occur in the dry etching process. Also, in the sacrifice oxidation, the long processing time is required in the conventional technique. To the contrary, in accordance with this first embodiment mode, the damage region can be removed within a short time due to the characteristic of high temperature hydrogen. Then, neither the surface concaves/convexes, nor the alteration layer are not left in the trench from which the damage has been removed. As a result, it is possible to set that the level produced from the alteration layer is not present. Also, the surface concaves/convexes can be extremely decreased.

As a result, when the epitaxial growth process is carried out in the post step, since the surface concaves/convexes are extremely small, it is possible to avoid the occurrence of the level within the epitaxial layer, which is caused by the surface concaves/convexes. As a consequence, with respect to the PN junctions formed by the respective layers which constitute the substrate 20, and the N$^-$ type channel layer 7, these PN junctions becomes junctions having small leak currents.

Second Embodiment

Next, a description is made of a semiconductor device manufacturing method according to a second embodiment mode of the present invention. Since this second embodiment mode is substantially same as the first embodiment mode, different points from those of the first embodiment mode will now be mainly explained.

FIGS. 4A to FIG. 4E are sectional views for schematically showing steps for manufacturing a semiconductor device according to a second embodiment of the present invention. These sectional views indicate steps for manufacturing an N$^-$ type channel layer 7 and a P$^+$ type of a second gate region 8 of a trench type J-FET similar to the first embodiment mode. In this second embodiment mode, a selective epitaxial-purpose mask is not formed in a trench 6 of a transistor cell portion, but is applied only to a trench of an alignment key region. As a result, an alignment of an embedding epitaxial step and alignments of an etch-back step and succeeding steps is secured.

Figure 4A:
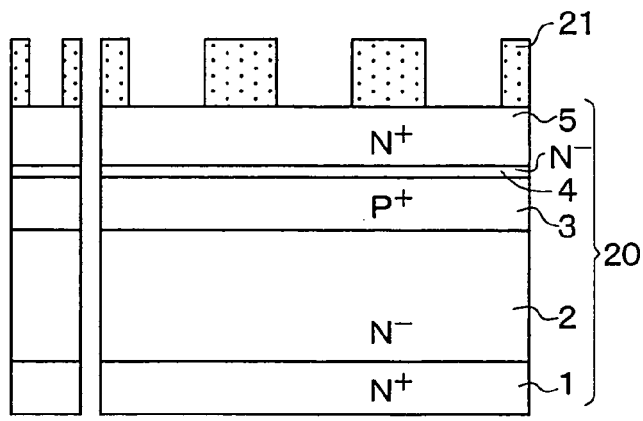
FIGS. 4A to 4E are cross sectional views explaining a method for manufacturing a semiconductor device according to a second embodiment of the present invention.

First, as shown in FIG. 4A, an LTO film 2 which constitutes a trench etching-purpose mask and an alignment key-purpose mask is formed on both a transistor cell portion and an alignment key portion at the same time.

Figure 4B:
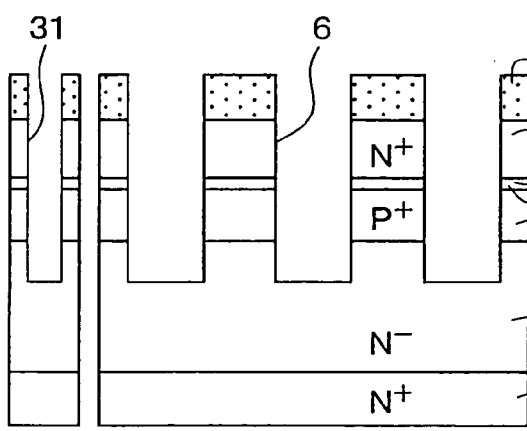

Next, as shown in FIG. 4B, while the LTO film 2 is employed as a mask, both a trench 6 and another trench 31 are formed in both the transistor cell portion and the alignment key portion in a manner similar to that of the first embodiment mode. Thereafter, the LTO film 2 which has been left during the trench etching process is completely removed by using hydrogen fluoride. As explained above, since the LTO film 2 is removed before a damage removing step, an adverse influence caused by an impurity contained in the etching mask material during the epitaxial growing process can be completely eliminated.

Figure 4D:
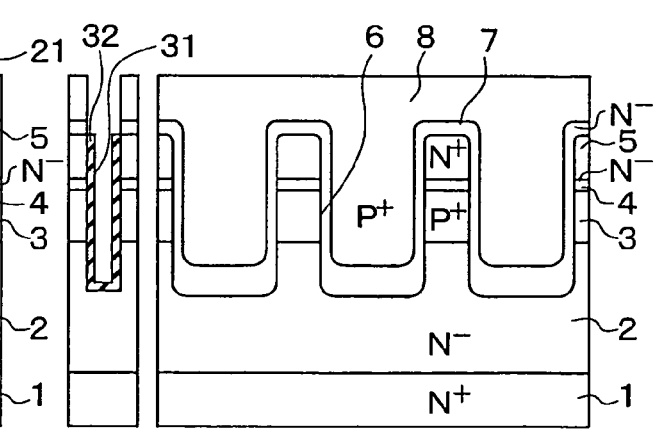
Figure 4C:
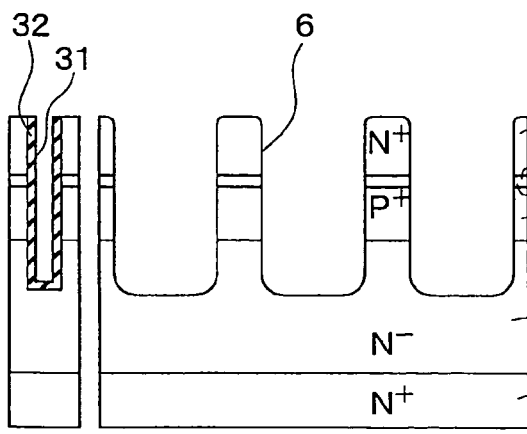

Next, as shown in FIG. 4C, a carbon film 32 is formed on at least on the trench 31 of the alignment key portion. At this time, the carbon film 32 is not formed in the vicinity of the trench 6 in the transistor cell portion by way of a photo-etching process.

A confirmation has been made that the carbon film 32 owns an anti-etching characteristic even in such a high temperature hydrogen atmosphere higher than, or equal to 1600° C. Thus, this carbon film 32 is continuously employed even in the damage removing step in the high temperature hydrogen atmosphere, and also in an epitaxial step in the post step. This carbon film 32 is easily formed when a photoresist which is generally employed in a semiconductor manufacturing process is thermally processed in a non-oxidation atmosphere. In the case that such a carbon film is removed which becomes unnecessary after the epitaxial step, when this unnecessary carbon film is thermally oxidized within a short time at a temperature of approximately 1000° C., then this unnecessary carbon film is readily removed.

Next, as represented in FIG. 4D, a damage in the trench etching process is removed, and both an N$^-$ type channel layer 7 and a P$^+$ type of a second gate region 8 are formed in a similar manner to that of the first embodiment mode. In this case, since there is no carbon film 32 in the vicinity of the trench 6 of the transistor cell portion, a damage removing process is carried out in a similar manner to that of the first embodiment mode, and further, a rounding process for rounding a corner portion of the trench 6 is carried out. On the other hand, since the carbon film 32 has been formed on the trench 31 of the alignment key portion, a damage removing process of the trench etching is not carried out, but also, the N⁻ type channel layer 7 and the P⁺ type of the second gate region 8 are not formed.

Figure 4E:
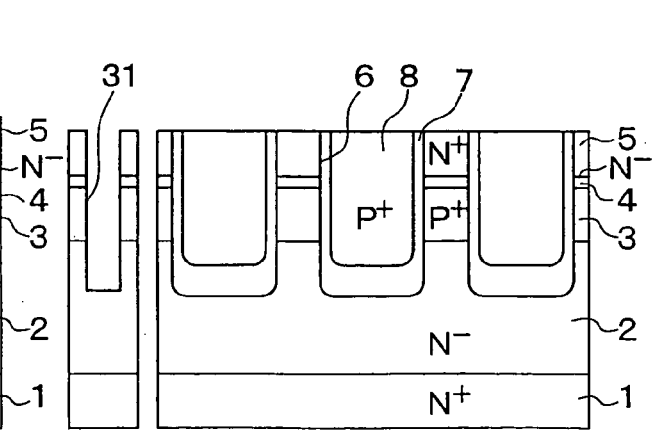

Thereafter, as shown in FIG. 4E, unnecessary portions as to the N⁻ type channel layer 7 and the P⁺ type of the second gate region 8, which have been formed on other portions than the trench 6, are etched back by employing CMP (Chemical Mechanical Polishing), and the like. The carbon film 32 formed on the trench 31 of the alignment key portion is removed by way of a thermal oxidation. As a result, such a transistor shape as indicated in FIG. 1 is formed in the transistor cell portion, whereas the trench 31 is formed in the alignment key portion, while this trench 31 constitutes a pattern which is required as an alignment mark of a photomask.

In such a case that a carbon film 32 which constitutes a selective mask is not formed, an alignment mark used for a pattern alignment is hardly observed after the epitaxial growth, and the alignment mark disappears in the etch-back step after the embedding layer has been formed. As a consequence, when the carbon film 32 which becomes the selective film is formed on the trench 31 which has been formed for the alignment purpose, then it is possible to avoid embedding when the epitaxial growing process is performed, and also, the alignment before and after the epitaxial growth can be secured. Alternatively, after the carbon film 32 which becomes the selective mask has been removed, since the trench 31 which has been formed for the alignment purpose is etched back while the depth of the trench 31 is measured in the etch-back step, the etching amount is controlled to be a desirable etching amount.

In this second embodiment mode, the thermal oxidation step for removing the carbon film has been carried out after the etch-back step. Alternatively, since the alignment mark is merely left as the final pattern, these respective steps are carried out in a reverse sequence with respect to the above-explained sequence.

Third Embodiment

Next, a description is made of a semiconductor device manufacturing method according to a third embodiment mode of the present invention. Since this third embodiment mode is substantially same as the first embodiment mode, different points from those of the first embodiment mode will now be mainly explained.

A third embodiment of the present invention is realized by executing the first embodiment mode, and by changing only a growth condition in an epitaxial step. That is, while such an etching gas as hydrogen chloride is mixed with $SiH_4$ and $C_3H_8$ corresponding to the material gas, and $H_2$ corresponding to the carrier gas, an epitaxial growing process is carried out. Concretely speaking, although depending upon a substrate temperature, while hydrogen chloride gas in approximately 1 to 5% of a hydrogen gas flow rate is mixed with the material gas and the carrier gas, the epitaxial growing process is carried out.

Since such a gas having the etching effect is conducted, even when the epitaxial growing process is carried out in a relative low temperature, such a condition that the etching effect is balanced with the deposition effect can be established. Also, in this case, etching of the side plane ("a" face) is quickened. Similar to the epitaxial growth at the temperature higher than, or equal to 1625° C., even when the substrate temperature is not reached to 1600° C., the N⁻ type channel layer 7 can be formed in order not to be brought into an overhang state, and the P⁺ type of the second gate region 8 can be formed in such a manner that no cavity occurs also in a trench whose aspect ratio is larger than, or equal to 2.

Fourth Embodiment

Figure 5:
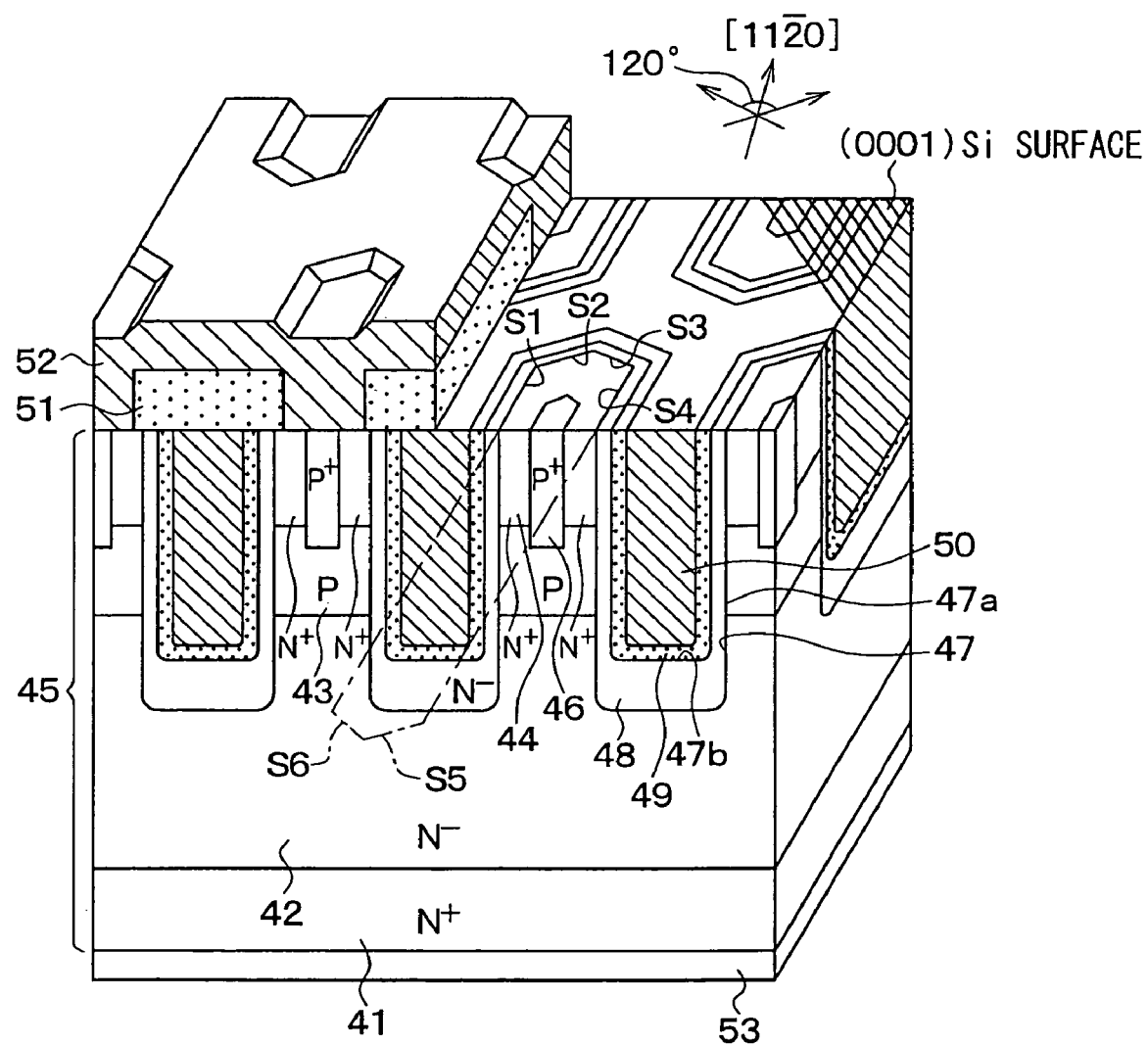
FIG. 5 is a partially enlarged perspective view showing a semiconductor device according to a fourth embodiment of the present invention.

Next, a description is made of a semiconductor device manufacturing method according to a fourth embodiment of the present invention. As the semiconductor device, one embodiment mode of the present invention is applied to forming of an N⁻ type channel layer of a trench type MOSFET. FIG. 5 is a perspective sectional view for indicating a portion of the trench type MOSFET according to this fourth embodiment mode.

As shown in FIG. 5, a high resistive N⁻ type drift layer 42, a P⁺ type base layer 43, and an N⁺ type source layer 44 have been sequentially stacked on a low resistive N⁺ type substrate 41 which is made of hexagonal-system silicon carbide. A semiconductor substrate 45 is constituted by the N⁺ type substrate 41, the N⁻ type drift layer 42, the P⁺ type base layer 43, and the N⁺ type source layer 44, while an upper plane thereof is defined as "(0001) Si" face.

An N⁺ type source layer 44 has been formed in a predetermined region of a surface layer portion within the P⁺ type base layer 43. Furthermore, a low resistive P⁺ type contact region 46 has been formed in a predetermined region of the surface layer portion within the P⁺ type base layer 43. Also, while a trench 47 has been formed in a predetermined region of the N⁺ type source layer 44, this trench 47 penetrates through both the N⁺ type source layer 44 and the P⁺ type base layer 43, and then, is reached to the N⁻ type drift layer 42. The trench 47 has a side plane 47a which is located perpendicular to the surface of the semiconductor substrate 45, and has another bottom plane 47b which is located parallel to the surface of the semiconductor substrate 45. Also, the side plane 47a of this trench 47 is elongated along a substantially [11–20] direction. Further, a plain shape of the side plane 47a of this trench 47 corresponds to a hexagonal shape, the respective internal angles of which are substantially equal to each other. In other words, when the semiconductor substrate 45 of FIG. 5 is viewed from the upper plane, such a layout of this hexagonal shape has been made, while 6 edges of this hexagonal shape are indicated by S1, S2, S3, S4, S5, and S6. That is, in this layout, an angle (internal angle) defined by the edge S1 and the edge S2 becomes substantially 120 degrees; an angle (internal angle) defined by the edge S2 and the edge S3 becomes substantially 120 degrees; an angle (internal angle) defined by the edge S3 and the edge S4 becomes substantially 120 degrees; an angle (internal angle) defined by the edge S4 and the edge S5 becomes substantially 120 degrees; an angle (internal angle) defined by the edge S5 and the edge S6 becomes substantially 120 degrees; and, an angle (internal angle) defined by the edge S6 and the edge S1 becomes substantially 120 degrees.

An N⁻ type channel layer 48 has been elongated over the surfaces as to the N⁺ type source layer 44, the P⁺ type base layer 43, and the N⁻ type drift layer 42 in the side plane 47a of the trench 47. The impurity concentration of this N⁻ type channel layer 48 is lower than the impurity concentration of the N⁺ type substrate 41, or the N⁺ type source layer 44. The N⁻ type channel layer 48 is manufactured by a thin film having a thickness of approximately 1000 to 5000 angstrom.

A crystalline type of the N⁻ type channel layer 48 is equal to that of the P⁺ type base layer 43, and becomes, for example, 4H—SiC. Although 4H—SiC is employed in this fourth embodiment mode, 6H—SiC, 3C—SiC, and the like are alternatively employed.

Further, a gate insulating film 49 has been formed on both the surface of the N⁻ type channel layer 48 within the trench 47, and the bottom plane 47b of the trench 47. Also, a gate electrode 50 has been filled inside the gate insulating film 49 within the trench 47. The gate electrode 50 has been covered by an insulating film 51. A source electrode 52 has been formed as a first electrode on both the surface of the N⁺ type source layer 44 and the surface of the P⁺ type contact region 46. A drain electrode 53 has been formed as a second electrode on a rear plane of the N⁺ type substrate 41.

Next, a method for manufacturing the trench type MOSFET shown in FIG. 5 will now be described with reference to a manufacturing step diagram indicated in FIG. 6A to FIG. 6C.

Figure 6A:
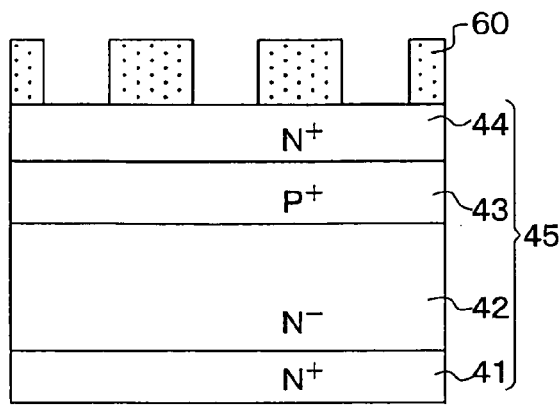
FIGS. 6A to 6D are cross sectional views explaining a method for manufacturing the semiconductor device shown in FIG. 5, according to the fourth embodiment.

[Manufacturing Step Shown in FIG. 6A]

First, such a semiconductor substrate 45 is prepared in which the N⁻ type drift layer 42, the P⁺ type base layer 43, and the N⁺ type source region 44 have been sequentially stacked on the N⁺ type substrate 41 having a (0001) Si face of silicon carbide. The N⁻ type drift layer 42, the P⁺ type base layer 43, and the N⁺ type source layer 44 are made of epitaxial films. Then, similar to the first embodiment mode, an LTO film 60 which will become a mask for a trench etching process is sequentially formed on an upper plane of this semiconductor substrate 45, and thereafter, the resulting semiconductor substrate 45 is patterned by way of a photolithography. As shown in FIG. 5, such a hexagonal-shaped pattern is employed as this pattern, which is located parallel to a direction <11–20>, and the internal angles of which are substantially equal to each other. This pattern is set in such a condition that a trench width is equal to, for example, 2 μm, and a distance between the trench patterns becomes, for example, 2 μm.

When such a pattern is formed, then both shapes and impurity concentration profiles of epitaxial films which are formed on the side plane of the trench becomes substantially equal to each other. As a result, channel width density of a transistor can be maximized, and furthermore, such a semiconductor device having a superior on/off characteristic can be provided similar to the stripe shape.

Figure 6D:
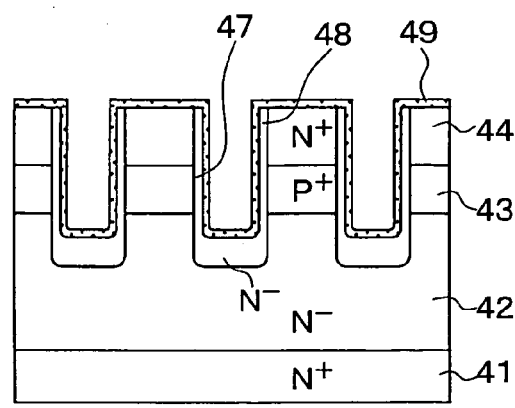
Figure 6B:
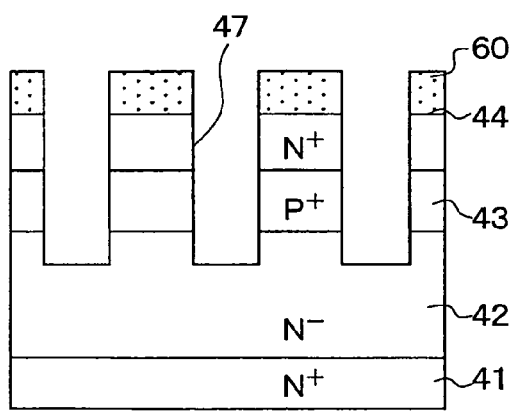

[Manufacturing Step Shown in FIG. 6B]

Next, a dry etching process for forming the trench 47 is carried out while the LTO film 60 is employed as a mask, such a trench 47 is formed which penetrates through the P⁺ type base layer 43 and is reached to the N⁻ type drift layer 42 under such a condition that as inclination angle thereof is larger than, or equal to 80 degrees; and a depth of the trench 47 is deeper than, or equal to 4 μm, namely, an aspect ratio is larger than, or equal to 2. At this time, due to damages caused by the dry etching process, surface concaves/convexes of on the order of 100 nm are produced on the side planes of the trench 47, and surface concaves/convexes of on the order of 10 nm are produced on the bottom plane of the trench 47. Also, alteration layers having depths of approximately 10 nm have been produced in the side planes and the bottom plane of the trench 47.

Figure 6C:
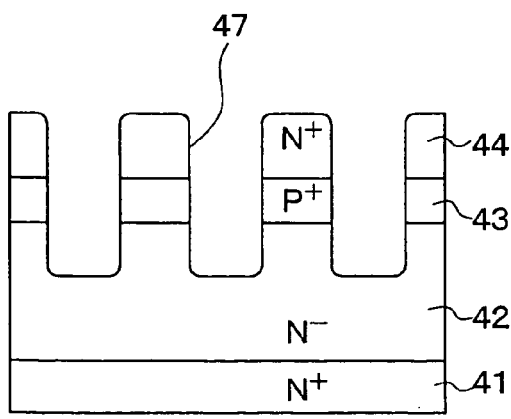

[Manufacturing Step Shown in FIG. 6C]

Next, a damage removing step is carried out in a similar manner to the first embodiment mode. At this time, especially, when the etching reaction mode is set to the surface reaction rate controlling in a front half of this manufacturing step, and the etching reaction mode is set to the vapor phase diffusion rate controlling in a rear half step thereof, then surface concaves/convexes of the trench side plane is reduced up to the atom order because of the surface reaction rate controlling in the front half step. Moreover, the corner portion of the trench bottom portion is made as a rounded shape having no facet plane because of the vapor phase diffusion rate controlling in the rear half step.

[Manufacturing Step Shown in FIG. 6D]

Next, an N⁻ type channel layer 48 made of an epitaxial thin film is continuously formed in the same semiconductor device as such a semiconductor device that the damage removing step has been carried out in a similar manner to the first embodiment mode. Thereafter, an oxide film, or the like is embedded inside the trench 47. Subsequently, an unnecessary N⁻ type channel layer 48 which has been formed on the non-trench portion is etched back by way of a CMP (Chemical Mechanical Polishing), or the like, and the oxide film embedded in the trench 47 is removed. Thereafter, a thermal oxidation is carried out so as to form the gate insulating film 49.

Thereafter, since a forming step of the P⁺ type contact region 46 is carried out, and the source electrode 52 and the drain electrode 53 are formed, such a trench type MOSFET shown in FIG. 5 is accomplished.

In the MOSFET manufactured in the above-described manner, the concaves/convexes of the trench side plane can be reduced in the atom order, and further, both the N⁻ type channel layer 48 and the gate oxide film 49 which have been formed on the trench side plane can become flat in the channel region. In other words, the trench type MOSFET can be realized from which the damage of the trench etching process has been eliminated, so that such a trench type MOSFET, the channel mobility and the gate oxide film lifetime of which are improved, can be manufactured.

Fifth Embodiment

Next, a description is made of a semiconductor device manufacturing method according to a fifth embodiment of the present invention. Since this fifth embodiment mode is substantially same as the fourth embodiment mode, different points from those of the fourth embodiment mode will now be mainly explained.

The manufacturing steps of this fifth embodiment mode are arranged by the above-described manufacturing steps of the fourth embodiment mode, from which the step for forming the N⁻ type channel layer 48, the subsequent step for embedding the oxide film into the trench 47, the etchback step, and the step for removing the embedded oxide film have been omitted. The manufacturing steps of the fifth embodiment mode are to manufacture an inverting type trench MOSFET.

In the case that such an inverting type trench MOSFET is formed, although there is no epitaxial step in the trench 47, after the trench 47 has been formed, a damage removing step is carried out similar to the fifth embodiment mode. As a result, more specifically, when the etching reaction mode is set to the surface reaction rate controlling in a front half of this manufacturing step, and the etching reaction mode is set to the vapor phase diffusion rate controlling in a rear half step thereof, then surface concaves/convexes of the trench side plane is reduced up to the atom order because of the surface reaction rate controlling in the front half step. Moreover, the corner portion of the trench bottom portion is made as a rounded shape having no facet plane because of the vapor phase diffusion rate controlling in a rear half step. As a result, such a trench type MOSFET having the superior MOS characteristic can be manufactured in the simple manufacturing steps, while this trench type MOSFET owns a superior voltage withstanding characteristic when the MOSFET is turned off.

It should be understood that the damage removing steps indicated in the above-described respective embodiment modes is alternatively carried out by a thermal process operation in a hydrogen atmosphere containing hydrocarbon.

Since hydrocarbon is added, etching of carbon atoms within the silicon carbide crystal is suppressed, and thus, an entire etching rate is lowered, and then, the etching reaction is further shifted to the side of the vapor phase diffusion rate controlling. As a consequence, when the thermal process operation is carried out in such a hydrogen atmosphere containing hydrocarbon, then an isotropic etching process is readily realized, as compared with an atmosphere containing only hydrogen. Concretely speaking, $C_3H_8$ is preferably employed as hydrocarbon. Since molecular weight of $C_3H_8$ is relatively large, $C_3H_8$ is easily thermally resolved, and moreover, vapor pressure thereof at 0° C. is 4.8 atm. As a result, when $C_3H_8$ is diluted by hyrdogen, $C_3H_8$ is not changed into a fluid, and can be easily handled as semiconductor material gas.

Further, the damage removing step is alternatively carried out by a thermal process in a hydrogen atmosphere containing inert gas such as Ar gas.

In the case that the atmospheric pressure is not changed, the addition of such an inert gas as Ar gas relatively lower concentration of hydrogen. As a result, there is no change as to the diffusion effect of the reaction product. However, the etching rate is lowered, and is shifted to the side of the vapor phase diffusion rate controlling which is similar to hydrocarbon. As a consequence, even when the inert gas such as Ar gas is added, the isotropic etching is easily realized, as compared with that of the atmosphere containing only hydrogen.

In the above-explained first embodiment mode, in FIG. 1, the sectional structure of the J-FET has been represented and explained. Alternatively, as shown in FIG. 5 of the fourth embodiment mode, the surface pattern of the trench 6 is formed as a hexagonal shape whose internal angles are equal to each other. As a consequence, the face orientation of the trench side planes becomes substantially equal to each other, so that the effect explained in the second embodiment mode is achieved.

Also, the present invention is applied to such a semiconductor device that after a trench is formed in a semiconductor substrate made of silicon carbide, an epitaxial layer is formed within this trench, for instance, is applied to a PN diode, and the like.

Furthermore, in the respective embodiment modes, such a semiconductor device that the first conductivity type is the N type and the second conductivity type is the P type has been exemplified. However, these conductivity types are merely exemplifications. Apparently, the present invention is applied to such a semiconductor device that the respective conductivity types have been inverted, as compared with the above-described conductivity types.

It should also be noted that when orientation of crystal is indicated, a bar (−) should be originally attached on a desirable numeral. However, since there are certain restrictions on the expressions as to the Japanese Patent filing rule using computers, it is so assumed in this specification that such a bar (−) is attached in front of the desirable numeral.

Sixth Embodiment

Figure 11:
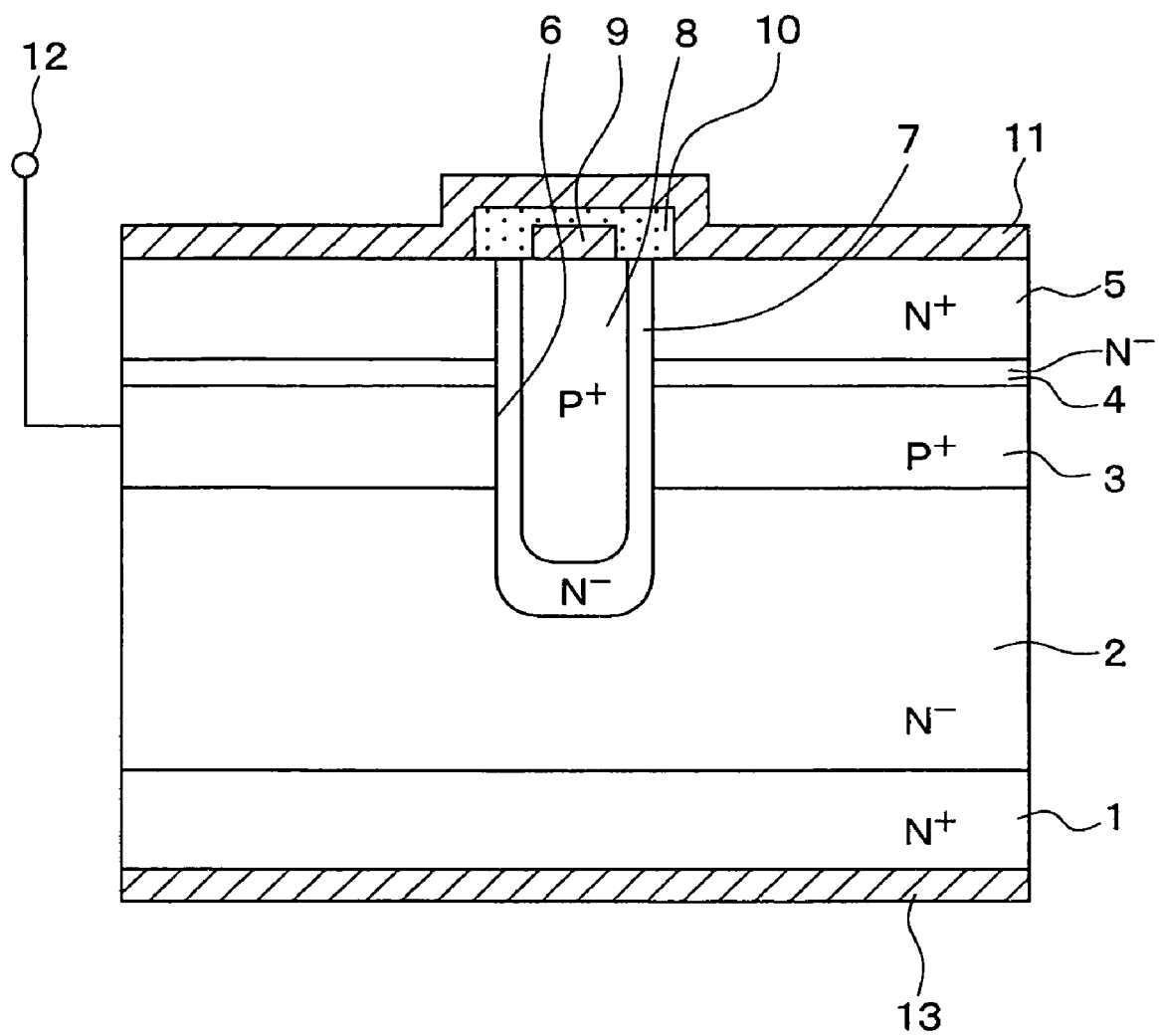
FIG. 11 is a cross sectional view showing a semiconductor device according to a sixth embodiment of the present invention.

FIG. 11 shows a sectional structure of a J-FET provided in a silicon carbide semiconductor device according to a sixth embodiment of the present invention.

A method of manufacturing the silicon carbide semiconductor device shown in FIG. 11 will now be described with reference to manufacturing steps for the silicon carbide semiconductor device indicated in FIGS. 12A to 12F.

Figure 12A:
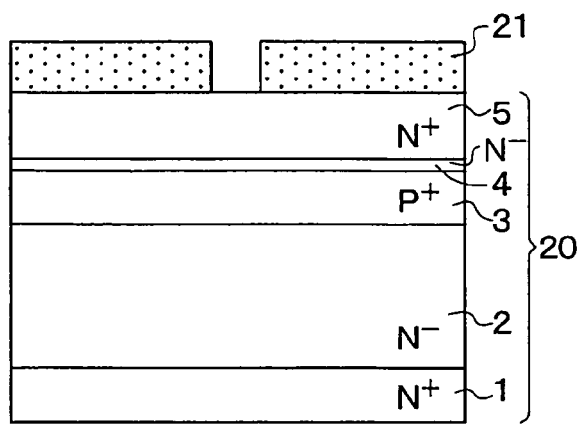
FIGS. 12A to 12F are cross sectional views explaining a method for manufacturing the semiconductor device shown in FIG. 11, according to the sixth embodiment.

In FIG. 12A, the $N^+$ type substrate 1 having the silicon carbide "(0001) Si" face or having the silicon carbide "(000-1) C" face is prepared. When the substrate 1 having such a face orientation is employed, even when the inclination angle of the trench 6 is not equal to, for example, 90 degrees, ratios of carbon atoms to silicon atoms, which are present on the surfaces of the side planes of the trench 6, is made substantially equal to each other. As a consequence, parameters of the semiconductor device can be easily designed.

Figure 12D:
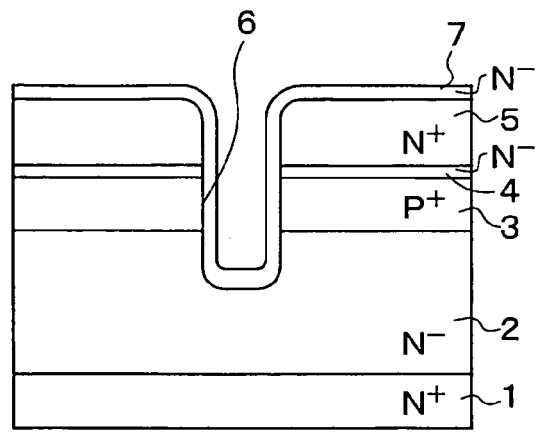
Figure 12B:
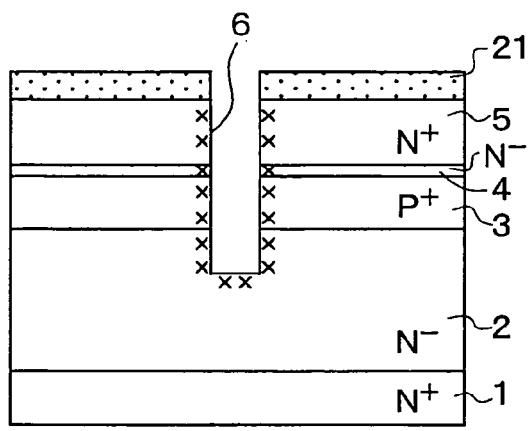

Next, as shown in FIG. 12B, a dry etching process for forming the trench 6 is carried out while the LTO film is employed as a mask, such a trench 6 is formed which penetrates through the first gate region 3 and is reached to the $N^-$ type drift layer 2 under such a condition that an inclination angle thereof is larger than, or equal to 80 degrees; and a depth of the trench 6 is deeper than, or equal to 4 μm, namely, an aspect ratio is larger than, or equal to 2. At this time, due to damages caused by the dry etching process, surface concaves/convexes of on the order of 0.1 μm are produced on the side planes of the trench 6. Also, alteration layers having depths of approximately 0.1 μm have been produced in the side planes and the bottom plane of the trench 6.

Figure 12E:
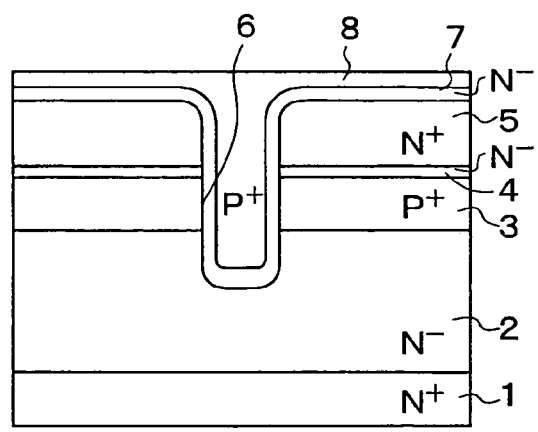
Figure 12C:
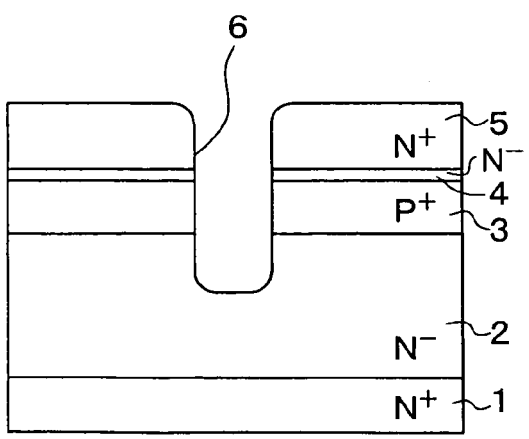

Next, as shown in FIG. 12C, a damage removing step for the trench etching process is carried out in a high temperature hydrogen atmosphere. Concretely speaking, a condition as to the damage removing step at this time has been determined based upon an experimental result.

Here, since the damage removing step is carried out for approximately 5 minutes, approximately 0.2 μm of the side planes of the trench 6 are etched away, so that the alteration layers are completely removed.

Also, at the same time, the LTO film 21 of the mask for the trench etching process is also completely removed. In other words, although the LTO film 21 has been employed as the mask for the trench etching process, an oxide film of a semiconductor grade owns such a feature that this oxide film is easily etched away, and moreover, such a contamination as a metal is not contained. As a consequence, when this feature is utilized, then both the damage removing step using high temperature hydrogen and a trench mask removing step can be executed at the same time. As a result, such a trench mask removing step can be omitted which is conceivable to be required between the trench forming step and the damage removing step with employment of the high temperature hydrogen.

In addition, at this time, the surface concaves/convexes of the trench side planes are also reduced by approximately 5 nm. Under the etching condition at this time, the etching reaction becomes the vapor phase diffusion rate controlling, so that an isotropic etching without depending on the crystal surface orientation is performed. As a result, such a trench corner portion as a trench opening portion and a trench bottom portion becomes a round shape having no facet plane. In this trench opening portion, this round shape can effectively quicken a penetration of material gas into the trench 6 when an epitaxial film is grown in the next manufacturing step. As a result, it is possible to avoid an occurrence of an overhang shape in the case that the aspect ratio of the trench 6 is set to be high. As a consequence, even when both the N⁻ type channel layer 7 and the P⁺ type of second gate region 8 are formed in the post step, the trench 6 can be embedded by these channel layer 7 and second gate region 8 in order not produce a cavity. On the other hand, since the trench bottom portion owns such an effect capable of distributing a crystal stress produced during the epitaxial growth so as to relax this crystal stress, such an epitaxial film having better crystalline can be formed.

Next, as shown in FIG. 12D, an N⁻ type channel layer 7 made of an epitaxial thin film is continuously formed in the same semiconductor device as such a semiconductor device that the damage removing step has been carried out.

Thus, since the epitaxial growth reaction becomes the vapor phase diffusion reaction, such an epitaxial film having better crystalline and less crystal stress distortion can be formed even in the trench corner portion and the trench bottom portion. Also, since both the etching and the deposition are activated, and also, the etching amount is balanced with the deposition amount, so that growth modes in which the growth rates are sequentially increased in this order of the trench side plane, the non-trench portion, and the trench bottom plane is realized. At the same time, since the growth rate of the lower portion in the side plane can be larger than the growth rate of the upper portion of this side plane, an occurrence of a so-called "overhang shape" can be suppressed.

Next, as shown in FIG. 12E, as an embedding layer, a P⁺ type of a second gate region 8 is formed under a similar epitaxial condition to that of the N⁻ type channel layer 7. When the second gate region 8 is formed, a different point from the forming of the N⁻ type channel layer 7 is given as follows. That is, since the type of this second gate region corresponds to a P type, tri-methyl aluminum is employed instead of $N_2$. As a result, the growth rates are sequentially increased in this order of the trench side plane, the non-trench portion, and the trench bottom plane. Then, also in the trench side plane, since the growth rate of the trench lower portion can be made large, as compared with that of the trench upper portion, the occurrence of the cavity can be avoided. Moreover, a removing amount in an etch-back step after the second gate region 8 has been formed is made smaller than the trench depth.

Figure 12F:
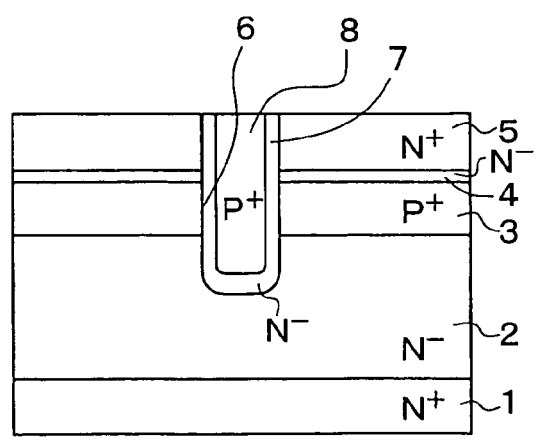

Next, as shown in FIG. 12F, unnecessary portions of both the N⁻ type channel layer 7 and the P⁺ type of the second gate region 8, which have been formed in the non-trench portion, are etched back by way of CMP (Chemical Mechanical Polishing), or the like. Thereafter, an electrode forming step, and the like are carried out in order that both the N⁻ type channel layer 7 and the P⁺ type of the second gate region 8 as to the trench-type J-FET represented in FIG. 11 are accomplished.

In accordance with this embodiment mode, the damage region can be removed within a short time due to the characteristic of high temperature hydrogen. Then, neither the surface concaves/convexes, nor the alteration layer are not left in the trench from which the damage has been removed. As a result, it is possible to set that the level produced from the alteration layer is not present. Also, the surface concaves/convexes can be extremely decreased.

As a result, when the epitaxial growth process is carried out in the post step, since the surface concaves/convexes are extremely small, it is possible to avoid the occurrence of the level within the epitaxial layer, which is caused by the surface concaves/convexes. As a consequence, with respect to the PN junctions formed by the respective layers which constitute the substrate 20, and the N⁻ type channel layer 7, these PN junctions becomes junctions having small leak currents.

Seventh Embodiment

FIG. 13A to FIG. 13E are sectional views for schematically showing steps for manufacturing a semiconductor device according to a seventh embodiment of the present invention. These sectional views indicate steps for manufacturing an N⁻ type channel layer 7 and a P⁺ type of a second gate region 8 of a trench type J-FET similar to the sixth embodiment mode. In this embodiment mode, a selective epitaxial-purpose mask is not formed in a trench 6 of a transistor cell portion, but is applied only to a trench of an alignment key region. As a result, an alignment of an embedding epitaxial step and alignments of an etch-back step and succeeding steps is secured.

Figure 13A:
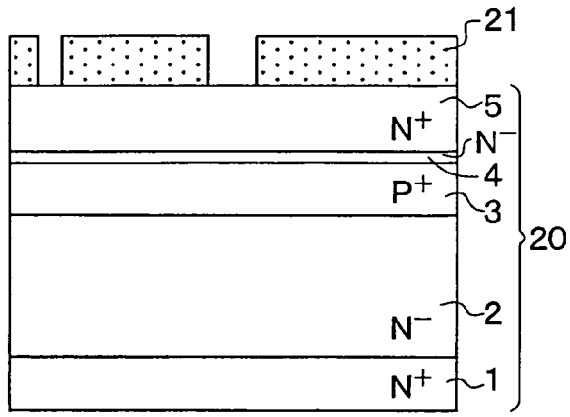
FIGS. 13A to 13E are cross sectional views explaining a method for manufacturing a semiconductor device according to a seventh embodiment of the present invention.

First, as shown in FIG. 13A, an LTO film 2 which constitutes a trench etching-purpose mask and an alignment key-purpose mask is formed on both a transistor cell portion and an alignment key portion at the same time.

Figure 13D:
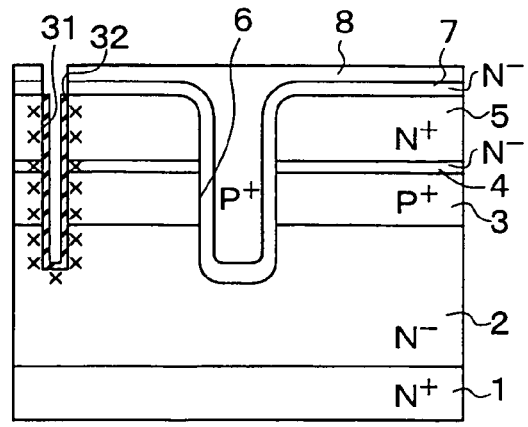
Figure 13B:
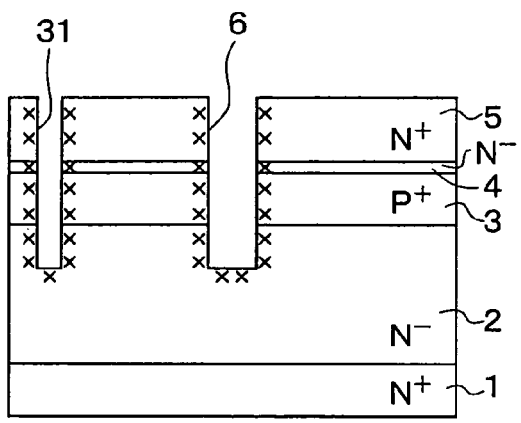
Figure 13E:
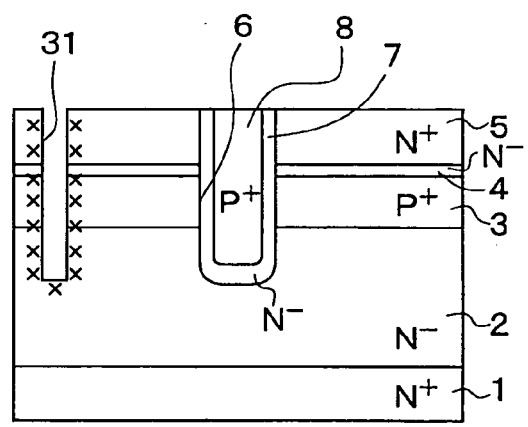

Next, as shown in FIG. 13B, while the LTO film 2 is employed as a mask, both a trench 6 and another trench 31 are formed in both the transistor cell portion and the alignment key portion in a manner similar to that of the first embodiment mode. Thereafter, the LTO film 2 which has been left during the trench etching process is completely removed by using hydrogen fluoride.

Figure 13C:
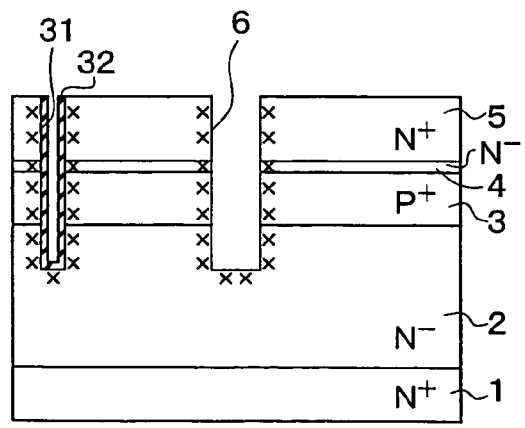

Next, as shown in FIG. 13C, a carbon film 32 is formed on at least on the trench 31 of the alignment key portion.

Next, as represented in FIG. 13D, a damage in the trench etching process is removed, and both an N⁻ type channel layer 7 and a P⁺ type of a second gate region 8 are formed in a similar manner to that of the sixth embodiment mode.

Thereafter, as shown in FIG. 4E, unnecessary portions as to the N⁻ type channel layer 7 and the P⁺ type of the second gate region 8, which have been formed on other portions than the trench 6, are etched back by employing CMP (Chemical Mechanical Polishing), and the like. The carbon film 32 formed on the trench 31 of the alignment key portion is removed by way of a thermal oxidation. As a result, such a transistor shape as indicated in FIG. 11 is formed in the transistor cell portion, whereas the trench 31 is formed in the alignment key portion, while this trench 31 constitutes a pattern which is required as an alignment mark of a photomask.

Eighth Embodiment

A semiconductor device manufacturing method according to an eighth embodiment of the present invention is provided with reference to FIG. 5. As the semiconductor device, one embodiment mode of the present invention is applied to forming of an N⁻ type channel layer of a trench type MOSFET.

As shown in FIG. 5, a high resistive N⁻ type drift layer 42, a P⁺ type base layer 43, and an N⁺ type source layer 44 have been sequentially stacked on a low resistive N⁺ type substrate 41 which is made of hexagonal-system silicon carbide. A semiconductor substrate 45 is constituted by the N⁺ type substrate 41, the N⁻ type drift layer 42, the P⁺ type base layer 43, and the N⁺ type source layer 44, while an upper plane thereof is defined as "(000-1) C", face.

Figure 14:
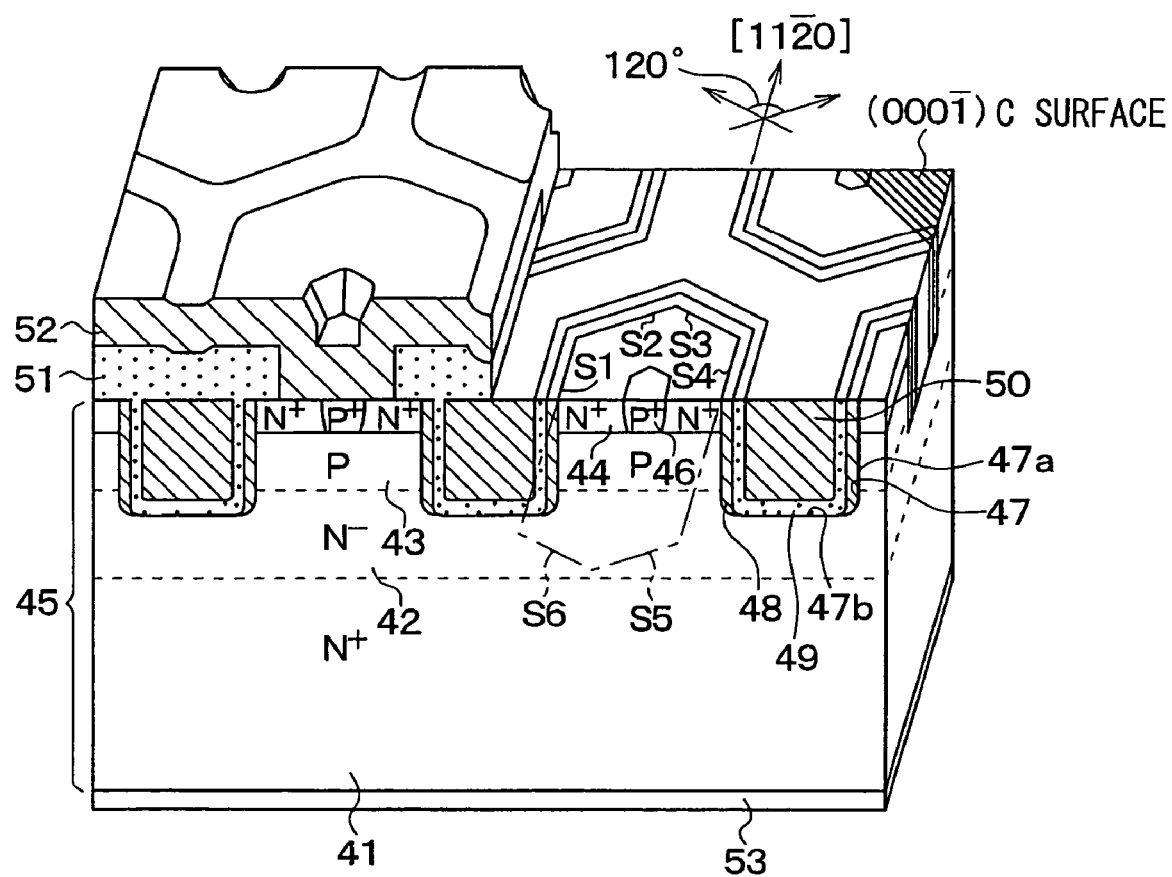
FIG. 14 is a partially enlarged perspective view showing a semiconductor device according to an eighth embodiment of the present invention.

Next, a method for manufacturing the trench type MOSFET shown in FIG. 14 will now be described with reference to a manufacturing step diagram indicated in FIG. 15A to FIG. 15D.

First, such a semiconductor substrate 45 is prepared in which the N⁻ type drift layer 42, the P⁺ type base layer 43, and the N⁺ type source region 44 have been sequentially stacked on the N⁺ type substrate 41 having a (000-1) C face of silicon carbide. The N⁻ type drift layer 42, the P⁺ type base layer 43, and the N⁺ type source layer 44 are made of epitaxial films. Then, similar to the first embodiment mode, an LTO film 60 which will become a mask for a trench etching process is sequentially formed on an upper plane of this semiconductor substrate 45, and thereafter, the resulting semiconductor substrate 45 is patterned by way of a photolithography. As shown in FIG. 5, such a hexagonal-shaped pattern is employed as this pattern, which is located parallel to a direction <11–20>, and the internal angles of which are substantially equal to each other. This pattern is set in such a condition that a trench width is equal to, for example, 2 μm.

Figure 15A:
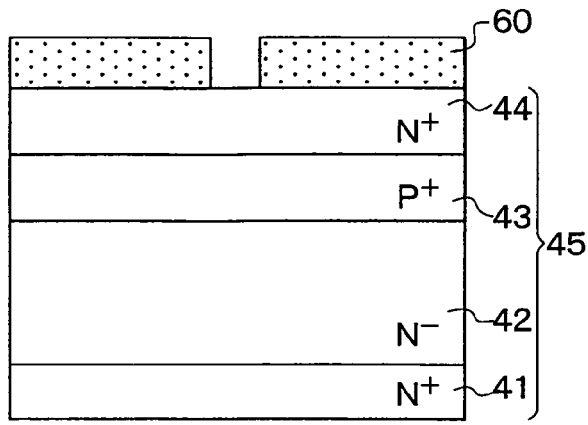
FIGS. 15A to 15D are cross sectional views explaining a method for manufacturing the semiconductor device shown in FIG. 14, according to the eighth embodiment.
Figure 15B:
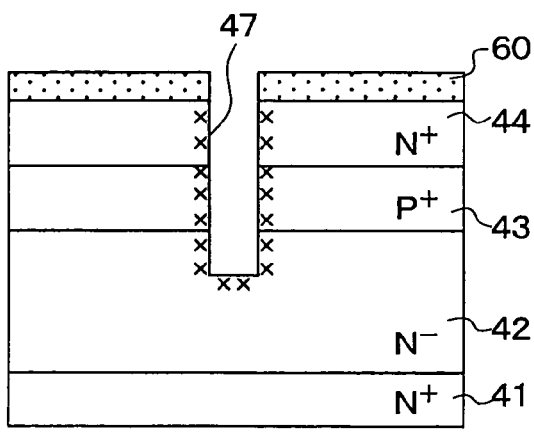

Next, as shown in FIG. 15B, a dry etching process for forming the trench 47 is carried out while the LTO film 60 is employed as a mask, such a trench 47 is formed which penetrates through the P⁺ type base layer 43 and is reached to the N⁻ type drift layer 42 under such a condition that as inclination angle thereof is larger than, or equal to 80 degrees; and a depth of the trench 47 is deeper than, or equal to 4 μm, namely, an aspect ratio is larger than, or equal to 2.

Figure 15C:
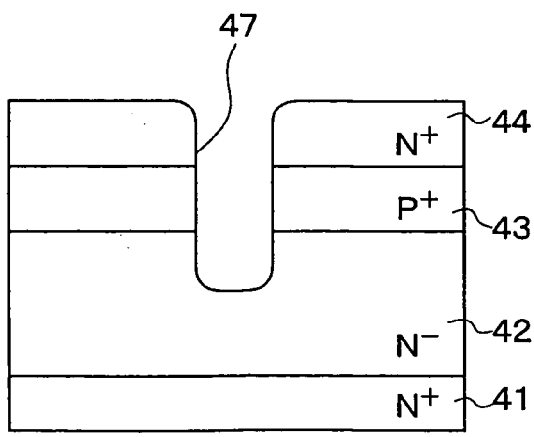

Next, as shown in FIG. 15C, a damage removing step is carried out in a similar manner to the first embodiment mode.

Figure 15D:
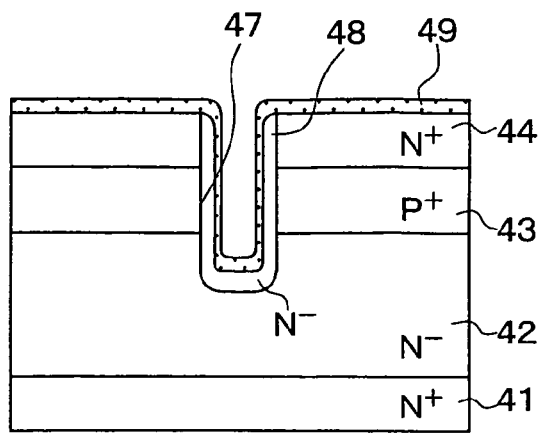

Next, as shown in FIG. 15D, an N⁻ type channel layer 48 made of an epitaxial thin film is continuously formed in the same semiconductor device as such a semiconductor device that the damage removing step has been carried out in a similar manner to the first embodiment mode. Thereafter, an oxide film, or the like is embedded inside the trench 47. Subsequently, an unnecessary N⁻ type channel layer 48 which has been formed on the non-trench portion is etched back by way of a CMP (Chemical Mechanical Polishing), or the like, and the oxide film embedded in the trench 47 is removed. Thereafter, a thermal oxidation is carried out so as to form the gate insulating film 49.

Thereafter, since a forming step of the P⁺ type contact region 46 is carried out, and the source electrode 52 and the drain electrode 53 are formed, such a trench type MOSFET shown in FIG. 5 is accomplished.

In the MOSFET manufactured in the above-described manner, the concaves/convexes of the trench side plane can be reduced in the atom order, and further, both the N⁻ type channel layer 48 and the gate oxide film 49 which have been formed on the trench side plane can become flat in the channel region. In other words, the trench type MOSFET can be realized from which the damage of the trench etching process has been eliminated, so that such a trench type MOSFET, the channel mobility and the gate oxide film lifetime of which are improved, can be manufactured.

In the respective embodiment modes, the J-FET in which the N⁻ type channel layer 7 is formed in the trench 6 has been exemplified as the silicon carbide semiconductor device. Alternatively, the present invention may be applied to such a semiconductor device having a structure other than the J-FET. For example, the present invention may be alternatively applied to such a semiconductor device having an MOS boundary plane, in which a trench is formed in a semiconductor substrate made of silicon carbide. In this MOS boundary plane, a gate electrode is formed via a gate insulating film within this trench.

In this case, after the trench in the semiconductor device having the MOS boundary plane has been formed, the above-described damage removing step is carried out. As a result, the alteration layer of the trench surface can be eliminated, and the concaves/convexes of the trench surface can be reduced, so that the channel mobility and the lifetime of the gate insulating film can be improved.

Ninth Embodiment

FIG. 18 shows a sectional structure of a J-FET provided in a silicon carbide semiconductor device according to a ninth embodiment of the present invention.

As indicated in FIG. 18, while an N⁺ type substrate 1 having a silicon carbide "(000-1) C" face has been employed and this N⁺ type substrate 1 is made in high impurity concentration equal to or higher than, for instance, $1 \times 10^{19}$ cm⁻³, an N⁻ type drift layer 2 has been formed on a major surface of this N⁺ type substrate 1, and this N⁻ type drift layer 2 is made in low impurity concentration of, for example, $1 \times 10^{13}$ to $5 \times 10^{15}$ cm⁻³. Also, a first gate region 3 made of a P⁺ type layer has been epitaxial-grown on the surface of the N⁻ type drift layer 2. This first gate region 3 is made in high impurity concentration of, for example, $5 \times 10^{17}$ to $5 \times 10^{19}$ cm⁻³.

Next, a method of manufacturing the silicon carbide semiconductor device shown in FIG. 18 will now be described with reference to manufacturing steps for the silicon carbide semiconductor device indicated in FIGS. 19A–19F.

Figure 19A:
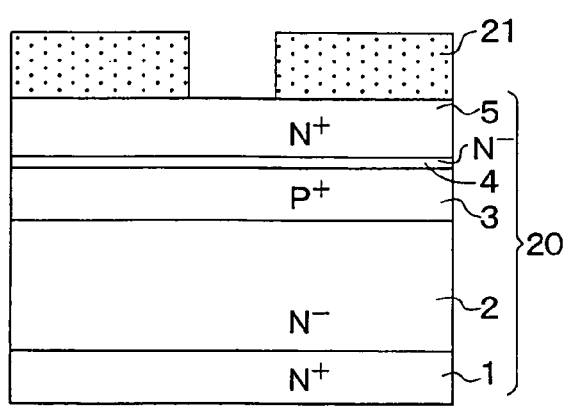
FIGS. 19A to 19F are cross sectional views explaining a method for manufacturing the semiconductor device shown in FIG. 18, according to the ninth embodiment.

First, as shown in FIG. 19A, the N⁺ type substrate 1 having the silicon carbide "(000-1) C" face is prepared.

Then, a semiconductor substrate 20 made of silicon carbide is prepared in which the N⁻ type drift layer 2, the P⁺ type first gate region 3, the N⁻ type region 4, and the N⁺ type source region 5 have been sequentially stacked on the N⁺ type substrate 1 having such a face orientation. The N⁻ type drift layer 2, the P⁺ type first gate region 3, the N⁻ type region 4, and the N⁺ type source region 5 are made of the epitaxial films. An LTO film (oxide film) 21 which will become a mask for a trench etching process is formed on an upper plane of this semiconductor substrate 20, and thereafter, the resulting semiconductor substrate 20 is patterned by way of a photolithography. As a pattern, such a stripe pattern is set in which a longitudinal direction of this opening portion is located parallel to the off direction of the substrate 20; a width (trench width) of the opening portion is set to, for example, 2 μm.

Figure 19B:
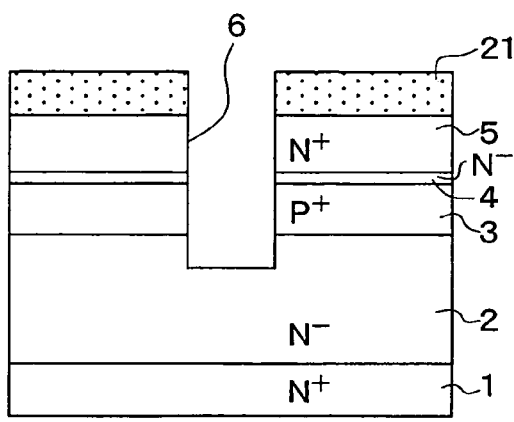

Next, as shown in FIG. 19B, a dry etching process for forming the trench 6 is carried out while the LTO film is employed as a mask, such a trench 6 is formed which penetrates through the first gate region 3 and is reached to the N⁻ type drift layer 2 under such a condition that an inclination angle thereof is larger than, or equal to 80 degrees; and a depth of the trench 6 is deeper than, or equal to 4 μm, namely, an aspect ratio is larger than, or equal to 2. At this time, due to damages caused by the dry etching process, surface concaves/convexes of on the order of 100 nm are produced on the side planes of the trench 6, and surface concaves/convexes of on the order of 10 nm are produced on the bottom plane of the trench 6. Also, alteration layers having depths of approximately 10 nm have been produced in the side planes, and alteration layers having depths of approximately 20 nm have been produced in the bottom plane of the trench 6.

Figure 19C:
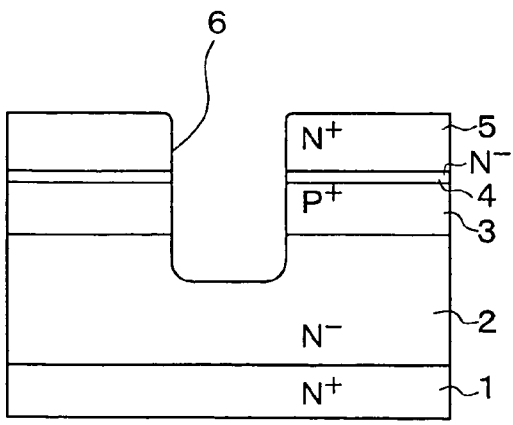

Next, as shown in FIG. 19C, a damage removing step for the trench etching process is carried out in a high temperature hydrogen atmosphere.

Since the damage removing step is carried out for approximately 2 minutes, approximately 80 nm of the side planes of the trench 6 are etched away, and approximately 200 nm of the bottom plane thereof is etched away, so that both the surface concaves/convexes and the alteration layers are completely removed.

Figure 19D:
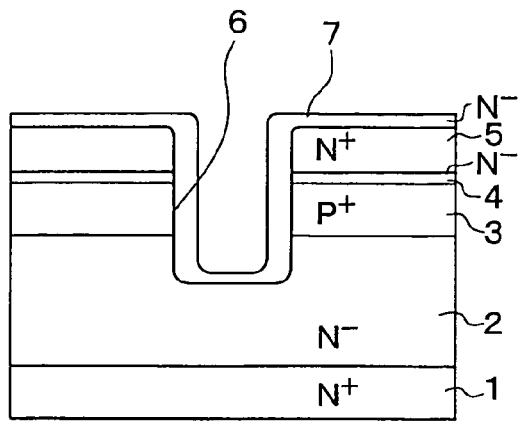

Next, as shown in FIG. 19D, an N⁻ type channel layer 7 made of an epitaxial thin film is continuously formed in the same semiconductor device as such a semiconductor device that the damage removing step has been carried out.

Figure 19E:
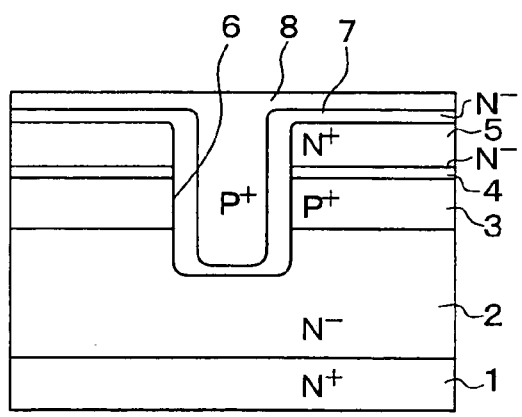

Next, as shown in FIG. 19E, as an embedding layer, a P⁺ type of a second gate region 8 is formed under a similar epitaxial condition to that of the N⁻ type channel layer 7. When the second gate region 8 is formed, a different point from the forming of the N⁻ type channel layer 7 is given as follows. That is, since the type of this second gate region corresponds to a P type, tri-methyl aluminum is employed instead of $N_2$. Also, in this case, as the etching amount is balanced with the deposition amount, the etching process on the bottom plane ("C" face) is quickened. Thus, the growth at the sidewall (i.e., a-surface) dominates. As a result, the growth rates are sequentially increased in this order of the non-trench portion, the trench bottom plane, and the trench side plane. Then, also in the trench side plane, since the growth rate of the trench lower portion can be made large, as compared with that of the trench upper portion, the occurrence of the cavity can be avoided. Moreover, a removing amount in an etch-back step after the second gate region 8 has been formed is made smaller than the trench depth.

Figure 19F:
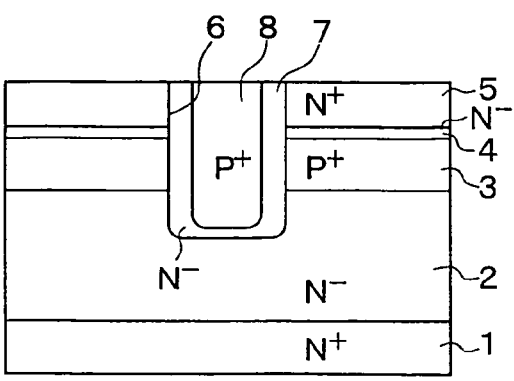

Next, as shown in FIG. 19F, unnecessary portions of both the N⁻ type channel layer 7 and the P⁺ type of the second gate region 8, which have been formed in the non-trench portion, are etched back by way of CMP (Chemical Mechanical Polishing), or the like. Thereafter, an electrode forming step, and the like are carried out in order that both the N⁻ type channel layer 7 and the P⁺ type of the second gate region 8 as to the trench-type J-FET represented in FIG. 18 are accomplished.

In accordance with this embodiment mode, the damage region can be removed within a short time due to the characteristic of high temperature hydrogen. Then, neither the surface concaves/convexes, nor the alteration layer are not left in the trench from which the damage has been removed. As a result, it is possible to set that the level produced from the alteration layer is not present. Also, the surface concaves/convexes can be extremely decreased.

Tenth Embodiment

FIG. 20A to FIG. 20E are sectional views for schematically showing steps for manufacturing a semiconductor device according to a tenth embodiment of the present invention. These sectional views indicate steps for manufacturing an N⁻ type channel layer 7 and a P⁺ type of a second gate region 8 of a trench type J-FET similar to the first embodiment mode. In this second embodiment mode, a selective epitaxial-purpose mask is not formed in a trench 6 of a transistor cell portion, but is applied only to a trench of an alignment key region. As a result, an alignment of an embedding epitaxial step and alignments of an etch-back step and succeeding steps is secured.

First, as shown in FIG. 20A, an LTO film 2 which constitutes a trench etching-purpose mask and an alignment key-purpose mask is formed on both a transistor cell portion and an alignment key portion at the same time.

Next, as shown in FIG. 20B, while the LTO film 2 is employed as a mask, both a trench 6 and another trench 31 are formed in both the transistor cell portion and the alignment key portion in a manner similar to that of the first embodiment mode. Thereafter, the LTO film 2 which has been left during the trench etching process is completely removed by using hydrogen fluoride.

Next, as shown in FIG. 20C, a carbon film 32 is formed on at least on the trench 31 of the alignment key portion.

Next, as represented in FIG. 20D, a damage in the trench etching process is removed, and both an N⁻ type channel layer 7 and a P⁺ type of a second gate region 8 are formed in a similar manner to that of the first embodiment mode.

Thereafter, as shown in FIG. 20E, unnecessary portions as to the N⁻ type channel layer 7 and the P⁺ type of the second gate region 8, which have been formed on other portions than the trench 6, are etched back by employing CMP (Chemical Mechanical Polishing), and the like. The carbon film 32 formed on the trench 31 of the alignment key portion is removed by way of a thermal oxidation.

Eleventh Embodiment

Figure 21:
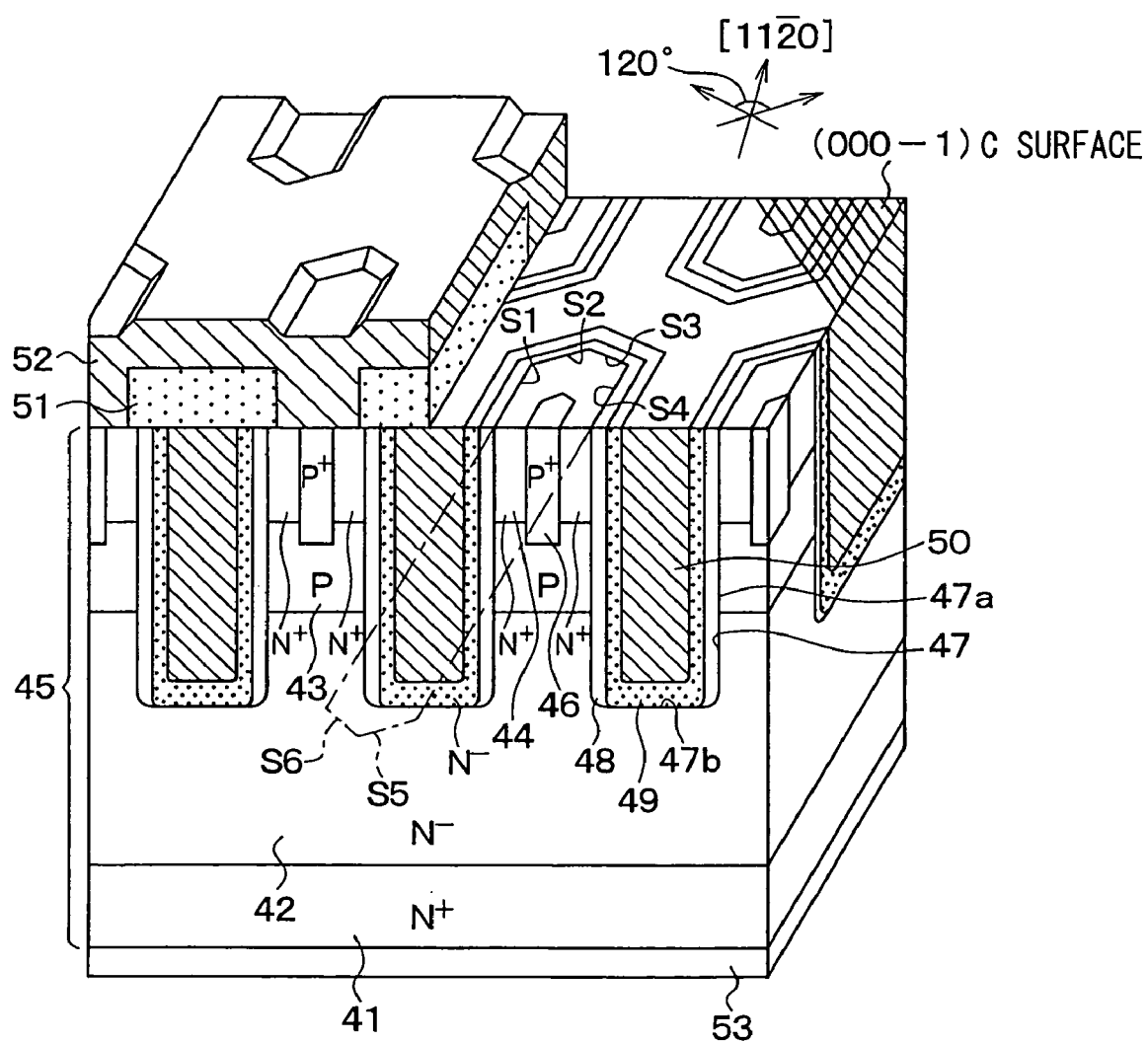
FIG. 21 is a partially enlarged perspective view showing a semiconductor device according to an eleventh embodiment of the present invention.

Next, a description is made of a semiconductor device manufacturing method according to an eleventh embodiment of the present invention. As the semiconductor device, one embodiment mode of the present invention is applied to forming of an N⁻ type channel layer of a trench type MOSFET. FIG. 21 is a perspective sectional view for indicating a portion of the trench type MOSFET according to this embodiment mode.

Next, a method for manufacturing the trench type MOSFET shown in FIG. 21 will now be described with reference to a manufacturing step diagram indicated in FIG. 22A to FIG. 22D.

Figure 22A:
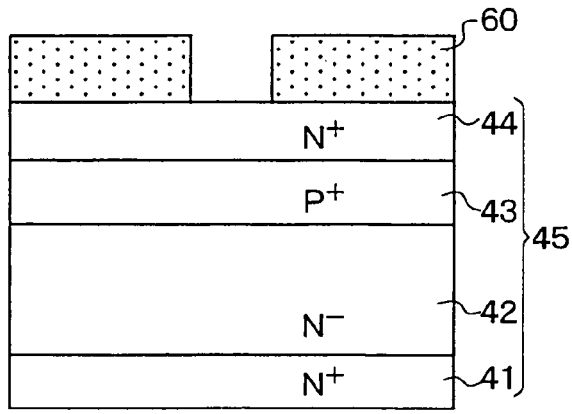
FIGS. 22A to 22D are cross sectional views explaining a method for manufacturing the semiconductor device shown in FIG. 21, according to the eleventh embodiment.

First, as shown in FIG. 22A, such a semiconductor substrate 45 is prepared in which the N⁻ type drift layer 42, the P⁺ type base layer 43, and the N⁺ type source region 44 have been sequentially stacked on the N⁺ type substrate 41 having a (000-1) C face of silicon carbide. The N⁻ type drift layer 42, the P⁺ type base layer 43, and the N⁺ type source layer 44 are made of epitaxial films. Then, similar to the first embodiment mode, an LTO film 60 which will become a mask for a trench etching process is sequentially formed on an upper plane of this semiconductor substrate 45, and thereafter, the resulting semiconductor substrate 45 is patterned by way of a photolithography.

Figure 22D:
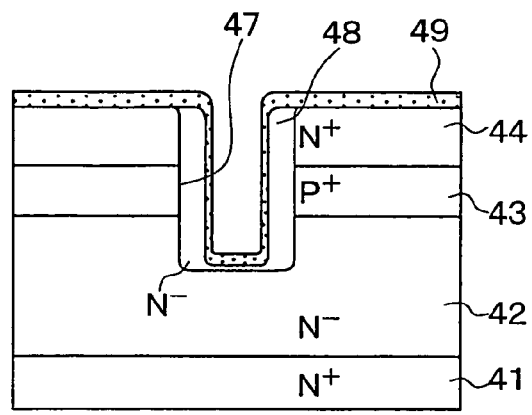
Figure 22B:
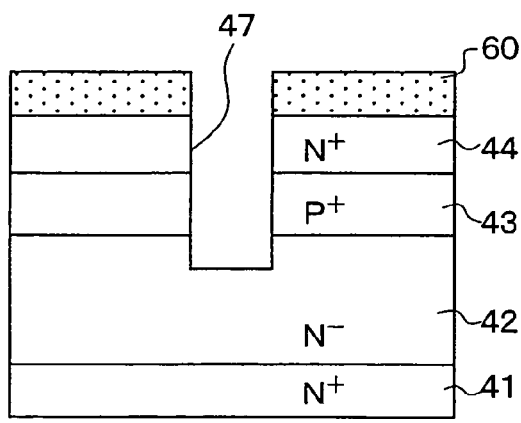

Next, as shown in FIG. 22B, a dry etching process for forming the trench 47 is carried out while the LTO film 60 is employed as a mask, such a trench 47 is formed which penetrates through the P⁺ type base layer 43 and is reached to the N⁻ type drift layer 42 under such a condition that as inclination angle thereof is larger than, or equal to 80 degrees; and a depth of the trench 47 is deeper than, or equal to 4 µm, namely, an aspect ratio is larger than, or equal to 2.

Figure 22C:
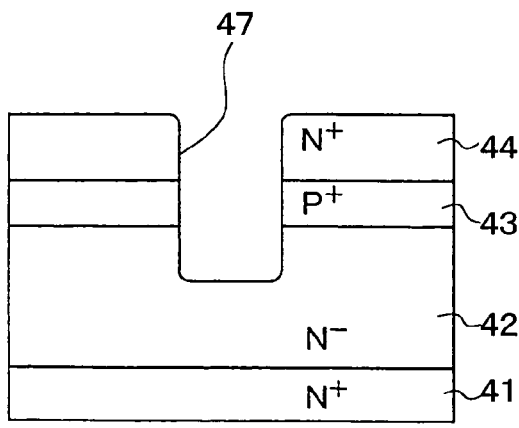

Next, as shown in FIG. 22C, a damage removing step is carried out in a similar manner to the tenth embodiment mode.

Next, as shown in FIG. 22D, an N⁻ type channel layer 48 made of an epitaxial thin film is continuously formed in the same semiconductor device as such a semiconductor device that the damage removing step has been carried out in a similar manner to the first embodiment mode. Thereafter, an oxide film, or the like is embedded inside the trench 47. Subsequently, an unnecessary N⁻ type channel layer 48 which has been formed on the non-trench portion is etched back by way of a CMP (Chemical Mechanical Polishing), or the like, and the oxide film embedded in the trench 47 is removed. Thereafter, a thermal oxidation is carried out so as to form the gate insulating film 49.

Thereafter, since a forming step of the P⁺ type contact region 46 is carried out, and the source electrode 52 and the drain electrode 53 are formed, such a trench type MOSFET shown in FIG. 21 is accomplished.

In the MOSFET manufactured in the above-described manner, the concaves/convexes of the trench side plane can be reduced in the atom order, and further, both the N⁻ type channel layer 48 and the gate oxide film 49 which have been formed on the trench side plane can become flat in the channel region. In other words, the trench type MOSFET can be realized from which the damage of the trench etching process has been eliminated, so that such a trench type MOSFET, the channel mobility and the gate oxide film lifetime of which are improved, can be manufactured.

Such changes and modifications are to be understood as being within the scope of the present invention as defined by the appended claims.

What is claimed is:

1. A method for manufacturing a silicon carbide semiconductor device, the method comprising the steps of:
   forming a trench mask for etching a trench on an upper surface of a semiconductor substrate made of silicon carbide;
   forming the trench in such a manner that the substrate is etched by using the mask so that the trench having an aspect ratio equal to or larger than 2 and having a trench slanting angle equal to or larger than 80 degrees is formed in the substrate; and
   removing a damage portion in such a manner that the damage portion disposed on an inner surface of the trench formed in the semiconductor substrate in the step of forming the trench is etched and removed in hydrogen atmosphere under decompression pressure at a temperature equal to or higher than 1600° C.

2. The method according to claim 1, wherein
the trench mask is formed on the substrate having a (0001)-Si surface.

3. The method according to claim 1, wherein
the trench mask is formed on the substrate having a (000-1)-C surface.

4. The method according to claim 1, further comprising the step of:
   removing the trench mask before the step of removing the damage portion.

5. The method according to claim 4, further comprising the step of:
   forming a selection mask in such a manner that the selection mask for selective epitaxial growth is formed on a part of the upper surface of the semiconductor substrate after the step of removing the trench mask, the part of the upper surface being different from the trench.

6. The method according to claim 1, wherein
in the step of removing the damage portion, the damage portion is removed by using a vapor phase diffusion rate control reaction so that a corner of the trench is rounded.

7. The method according to claim 1, wherein
in the step of removing the damage portion, the damage portion is removed by using a vapor phase diffusion rate control reaction so that a corner of the trench is isotropically etched and rounded.

8. The method according to claim 7, wherein
in the step of removing the damage portion, the damage portion is removed under a condition of $P \times 1.33 \times 10^2 \geq A/T-B$, in which P represents an atmospheric pressure in Pa, T represents a substrate temperature in °C., A represents $4.16 \times 10^6$, and B represents $2.54 \times 10^4$.

9. The method according to claim 1, wherein
the step of removing the damage portion is performed at a temperature equal to or lower than 1700° C.

10. The method according to claim 1, wherein
in the step of removing the damage portion, the damage portion is removed by a heat treatment in a hydrogen atmosphere including hydrocarbon.

11. The method according to claim 1, wherein
in the step of removing the damage portion, the damage portion is removed by a heat treatment in a hydrogen atmosphere including inert gas.

12. The method according to claim 1, wherein
the trench has a predetermined pattern including a plurality of trenches with a distance therebetween, and
the distance is determined in such a manner that a flat surface of the substrate between the trenches disappears in a latter step of forming an embedded layer in the trench.

13. The method according to claim 12, wherein
the distance between the trenches is equal to or smaller than a trench width.

14. The method according to claim 1, further comprising the step of:
   forming an embedded layer in such a manner that an epitaxial layer as the embedded layer is formed in the trench at a temperature equal to or higher than 1500° C. by an epitaxial growth method after the step of removing the damage portion.

15. The method according to claim 14, wherein
the step of forming the embedded layer is performed at a temperature equal to or higher than 1550° C.

16. The method according to claim 15, wherein
the step of forming the embedded layer is performed at a temperature equal to or higher than 1625° C.

17. The method according to claim 14, wherein
the step of removing the damage portion and the step of forming the embedded layer are successionally performed by using same equipment.

18. The method according to claim 14, wherein
the step of forming the embedded layer is performed by using a vapor phase diffusion rate control reaction so that a corner of the embedded layer is rounded.

19. The method according to claim 18, wherein
the step of forming the embedded layer provides a growth rate of the embedded layer equal to or smaller than 2.5 μm per hour.

20. The method according to claim 19, wherein
the step of forming the embedded layer provides a growth rate of the embedded layer at a sidewall of the trench equal to or smaller than 2.5 μm per hour.

21. The method according to claim 14, wherein
the step of forming the embedded layer is performed at a temperature equal to or lower than 1700° C.

22. The method according to claim 14, wherein
in the step of forming the embedded layer, the embedded growth is performed by using a gas including a raw material gas, a carrier gas and a gas having etching effect.

23. The method according to claim 22, wherein
the gas having the etching effect is a hydrochloric gas.

24. The method according to claim 14, wherein
the step of forming the embedded layer is performed by a concentration control in such a manner that an impurity concentration in the beginning of the step of forming the embedded layer is different from that in the ending of the step of forming the embedded layer.

25. The method according to claim 24, wherein
in the step of forming the embedded layer, the concentration is controlled in such a manner that the impurity concentration in the ending of the step of forming the embedded layer is higher than that in the beginning of the step of forming the embedded layer.

26. The method according to claim 1, wherein
the semiconductor substrate has a (0001)-Si surface or a (000-1)-C surface.

27. The method according to claim 1, wherein
the step of forming the trench is performed in such a manner that a surface pattern of the trench becomes a stripe pattern, in which the pattern of the trench is parallel to an offset direction of the semiconductor substrate.

28. The method according to claim 1, wherein
the step of forming the trench is performed in such a manner that a surface pattern of the trench becomes a hexagonal pattern, all inner angles of which are the same.

* * * * *